(12) United States Patent
Arai et al.

(10) Patent No.: US 7,575,952 B2
(45) Date of Patent: Aug. 18, 2009

(54) MANUFACTURING METHOD OF SEMICONDUCTOR DEVICE HAVING ORGANIC SEMICONDUCTOR FILM

(75) Inventors: Tadashi Arai, Kumagaya (JP); Shinichi Saito, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/797,419

(22) Filed: May 3, 2007

(65) Prior Publication Data
US 2007/0259478 A1 Nov. 8, 2007

Related U.S. Application Data

(62) Division of application No. 11/591,564, filed on Nov. 2, 2006.

(30) Foreign Application Priority Data
Nov. 2, 2005 (JP) ............................. 2005-319244

(51) Int. Cl.
H01L 51/40 (2006.01)
(52) U.S. Cl. ............ 438/99; 257/E21.174; 257/E29.273
(58) Field of Classification Search ................. 257/758, 257/40, E21.174; 438/99
See application file for complete search history.

(56) References Cited
U.S. PATENT DOCUMENTS

| 6,433,359 B1* | 8/2002 | Kelley et al. ................... 257/40 |
| 6,806,124 B2* | 10/2004 | Klauk et al. ................... 438/149 |
| 2003/0234398 A1* | 12/2003 | Aoki et al. ..................... 257/72 |
| 2004/0129978 A1* | 7/2004 | Hirai ............................. 257/347 |
| 2005/0043504 A1* | 2/2005 | Wu et al. ..................... 528/380 |
| 2005/0051780 A1* | 3/2005 | Ando et al. .................... 257/72 |
| 2005/0129843 A1* | 6/2005 | Wu et al. ..................... 427/180 |
| 2005/0221530 A1* | 10/2005 | Cheng et al. .................. 438/82 |
| 2006/0124922 A1* | 6/2006 | Kim et al. ..................... 257/40 |
| 2006/0128165 A1* | 6/2006 | Theiss et al. ................. 438/795 |
| 2006/0160277 A1* | 7/2006 | Sirringhaus et al. ......... 438/149 |
| 2006/0273303 A1* | 12/2006 | Wu et al. ..................... 257/40 |
| 2006/0286726 A1* | 12/2006 | Sirringhaus et al. ......... 438/151 |
| 2006/0286737 A1* | 12/2006 | Levy et al. ................... 438/199 |

FOREIGN PATENT DOCUMENTS

| JP | 2003-013242 | 1/2003 |
| JP | 2003-158134 | 5/2003 |
| JP | 2004-080026 | 3/2004 |

* cited by examiner

Primary Examiner—Marcos D. Pizarro
Assistant Examiner—Igwe U. Anya
(74) Attorney, Agent, or Firm—Antonelli, Terry, Stout & Kraus, LLP.

(57) ABSTRACT

A method of manufacturing a semiconductor device having an organic semiconductor film comprises a step of preparing a transparent substrate at least having an opaque gate electrode and a gate insulator thereover, a step of forming a layer containing metal-nano-particles as a conductive layer for a source electrode and a drain electrode to the thus prepared transparent substrate, a step of applying exposure to the transparent substrate on the side of a surface not mounted with the opaque gate electrode, a step of flushing away a portion other than the source electrode and the drain electrode in the layer containing the metal-nano-particles after the exposure, and a step of forming an organic semiconductor layer forming a channel portion. Lower and upper electrodes are positioned in self-alignment manner and thus no positional displacement occurs even if a printing method is used. Accordingly, semiconductor devices such as flexible substrates using an organic semiconductor can be manufactured inexpensively by using a printing method.

5 Claims, 23 Drawing Sheets

MANUFACTURING METHOD OF SEMICONDUCTOR DEVICE HAVING ORGANIC SEMICONDUCTOR FILM

CLAIM OF PRIORITY

The present application claims priority from Japanese application JP 2005-319244 filed on Nov. 2, 2005, the content of which is hereby incorporated by reference into this application. This application is a Divisional application of application Ser. No. 11/591,564, filed Nov. 2, 2006, the contents of which are incorporated herein by reference in their entirety.

BACKGROUND OF THE INVENTION

1. Field of the Invention

The present invention relates to a method of manufacturing a semiconductor device having an organic thin film.

2. Description of the Prior Art

In recent years, various studies and developments have been performed for display devices having a thin film transistor (hereinafter referred to as TFT). Since TFTs consume less electric power and can save spaces, they have been used as transistors for driving display devices for mobile equipment such as mobile telephones, notebook personal computers, and PDAs. Most portions of such TFTs are formed of inorganic semiconductor materials typically represented by crystalline silicon or amorphous silicon. The reason is that they can be manufactured by using existent manufacturing steps or manufacturing technology for semiconductor devices. However, in the case of using the semiconductor manufacturing steps, since the processing temperature upon forming a semiconductor film is as high as 350° C. or higher, there is a restriction on the substrates that can be formed. In particular, the heat resistance temperature of most of flexible materials typically represented by plastics is often 350° C. or lower and manufacture of TFTs of inorganic semiconductor materials using usual semiconductor manufacturing steps has been difficult.

For the problem described above, research and development have recently proceeded on TFT devices using organic semiconductor materials (hereinafter simply referred to as organic TFT) that can be manufactured at a low temperature. In the organic TFT, since organic semiconductor films can be formed at a low temperature, they can be formed also on substrates with low heat resistance such as plastic material. Accordingly, new flexible devices not used in the prior art can be manufactured.

For the method of forming an organic semiconductor film upon forming an organic TFT, a most suitable method has been used selectively among a printing method, for example, ink jet printing, a spin coating method, a spray method, a vapor deposition method, or dip method depending on the organic semiconductor material. For example, a low molecular weight compound such as pentacene derivative is formed into a film by the vapor deposition method, etc., and a polymeric compound such as polythiophene derivative is formed into a film from a solution. An example concerning the manufacturing method of a semiconductor device using a thin organic film transistor is disclosed, for example, in JP-A No. 2004-80026. In this example, saving the amount of the organic semiconductor material to be used has been considered by utilizing the capillary phenomenon.

Research and development have recently been performed for further reduction of the cost by manufacturing a channel portion of TFTs by a small amount of organic semiconductor material with no wasteful loss by using a printing step typically represented by ink jetting, micro-dispensing or transfer method. In addition, research and development of manufacturing also electrodes or wiring portions by printing has started.

Further, the study of a method with no positional displacement without requiring a photo-mask has started. For example, JP-A No. 2003-158134 discloses a method of using a photosensitive composition and forming a gate pattern with no positional displacement by photolithography from the rear face using source and drain electrodes as a mask.

Further, a method that does not use the photolithography for the photosensitive composition has also been studied. JP-A No. 2003-13242 is an example.

SUMMARY OF THE INVENTION

As described above, The TFT manufacturing method using the printing technique has a feature capable of reducing the cost. However, the positioning accuracy in current printing techniques is about 20 μm and it is about several μm even by the use of a modern techniques. Accordingly manufacture of the fine TFTs is difficult if the printing step is used. In particular, when positional displacement occurs between a gate electrode (lower electrode) and a source/drain electrodes (upper electrode), it results in problems such as increase in the parasitic capacitance or fluctuation in the performance in the case where a plurality of TFTs are prepared. It is said that the positional displacement occurs in the ink jet method of flying a material jetted out from a nozzle to a substrate. It is considered that the positional displacement occurs in the transfer method in the case of transferring the material from a transfer roll to the substrate.

Accordingly, at present, a printing step is used for forming the organic semiconductor film or in the wiring step, an existent semiconductor step is used, for example, in the formation of an insulator or formation of a contact hole, and a printing or existent semiconductor step is used in the formation of an electrode. In this case, the manufacturing cost is increased since both of the methods are combined and the manufacturing facilities become versatile such as photolithographic apparatus, printing apparatus, film deposition apparatus, etching apparatus, etc. or photomask is necessary for contact hole forming step, electrode forming step, etc.

The countermeasure includes a method free of the positional displacement not requiring the photomask described above, for example, as disclosed in JP-A No. 2003-158134. In the use of the method, while a pattern with no positional displacement can be formed, since a photolithographic step for the photosensitive composition is included, steps such as photosensitive composition coating, heating, exposure, and development are necessary and they increase the cost and the time it takes in the apparatus for each of the steps. Further, in the case of using the photolithographic step for the photosensitive composition used in usual semiconductor steps, there is a possibility that a special substrate such as a flexible substrate can not be used. Further, using an organic substrate such as made of a plastic material for the substrate results in a problem that the substrate is dissolved by a solvent for the photosensitive composition.

Further, a method that does not use photolithography for the photosensitive composition has also been studied. JP-A No. 2003-13242 is one of examples. In this method, a substrate intended to be formed with a pattern is placed in a solution of metal-nano-particles, and laser exposure is applied through a photomask thereby forming a pattern on the substrate by electroless plating. However, this method requires a photomask, resulting in increased cost. Further, using a large scale substrate needs a solution of a great amount of metal-nano-particles. As a result, it takes an enormous cost. Further, the concentration of the solution of metal-nano-particles changes, or grain size of metal-nano-particles changes on every formation of electrodes. In the case where the solution is replaced on every exposure, the cost is increased.

Under the background of such problems, the invention intends to provide a method of manufacturing a thin organic film transistor having a fine pattern shape and having electrodes in which a lower electrode and an upper electrode positioned extremely finely to each other with extremely less displacement are opposed by way of an insulator by using a printing method without using the photomask and the photolithographic step for the photosensitive composition. According to the method of the invention, it is also possible to obtain a fine pattern shape of about 20 µm. Further, it is also possible to position the lower electrode and the upper electrode of the thin organic film transistor within 1 µm.

The present invention provides a method of manufacturing a semiconductor device having a thin organic film transistor adaptable to various substrates in which the device is formed by using the printing technique without using lithography for a photosensitive composition and an upper electrode is arranged in self-alignment with a lower electrode.

In this case, it is possible to adopt (1) a method of using photolithography by exposure from the rear face using a lower electrode as a mask, or (2) a method of attaining self-alignment between the upper electrode and the lower electrode by using the difference of a contact angle with water between the surface of the substrate and the surface of the gate insulator. That is, the typical concept of the present invention includes the following two modes.

The first method uses a step of forming a source and drain electrode materials directly by an exposure method without using a usual photomask only for the positioning step for the upper electrode and the lower electrode. Further, it is preferred to form all other steps by the printing method with a view point of easy manufacture.

The gist of this method is as described below. An opaque gate electrode (referred to as a lower electrode since it is on the side of a substrate with reference to the surface of the substrate) is prepared by using a transparent substrate, and conducting, for example, printing and baking using a conductive material on the transparent substrate. Then, a transparent insulator, and a solution of metal-nano-particles as the materials for source and drain electrodes are laminated thereover successively for a required area, for example, by a printing method. Then, by exposing a layer of metal-nano-particles layer from the rear face of a substrate using the lower electrode as a mask, the metal-nano-particles are solidified and secured. Then, unnecessary portion of the layer of metal-nano-particles is removed by applying rinsing and a pattern for the source electrode and drain electrode positioned on the side of the lower electrode can be formed. Thus, the lower electrode and the upper electrode can be positioned accurately. Then, the thin organic film transistor is formed by printing or vapor depositing the organic semiconductor material just above the lower electrode. It will be apparent that a wavelength at which the metal-nano-particles are solidified by light absorption is used in the exposure. Further, it should be noted that that the metal-nano-particles are fine particles having nano order metal cores used usually. Further, they include those with or without protective film around the core. In the examples of the invention, those having the protective film are used. With no protective film, since the metal-nano-particles can not be present stably for a long time (about one-half month), a care has to be taken.

The invention can of course be practiced by conducting the step of forming the organic semiconductor film and the step of forming the source/drain electrode layer by using the metal-nano-particles with no restriction on the order of the step.

The second method does not use the exposure on the side of the rear face of the substrate as in the first method but uses a step of printing the source and drain electrodes by utilizing the difference for hydrophilic and hydrophobic properties with water between the surface of the substrate and the surface of the gate insulator surface. The step is basically as follows. A gate electrode is prepared on the surface of a substrate and a gate insulator is formed so as to cover the gate electrode. In this case, it is prepared with a difference for the hydrophilic property and the hydrophobic property relative to water between the surface of the gate insulator and the surface of the substrate other than the gate insulator. The hydrophilic property and the hydrophobic property may be judged by comparing property relative to the liquid between both of the regions to be compared. Further, more specifically and quantitatively, a material causing a difference of the property as 30 degree or more, preferably, 60 degree or more should be used for the difference of contact angle relative to the water between the surface of the insulator and the surface of the substrate (hereinafter, general description is to be made by way of the terms of hydrophilic property and hydrophobic property). Then, a conductive material solution is coated at least including a region corresponding to a channel region. In the case where the contact angle at the surface of the substrate in a region where the source and drain electrodes are mounted is smaller than that of the gate insulator, since it can be regarded hydrophilic, the source electrode and the drain electrode are formed by printing using a solution of a water soluble conductive material. Thus, the solution of the conductive material for the source and the drain electrodes is not present in the gate insulator and it is possible to mount the solution of the conductive material in the region for the source and the drain electrodes. On the other hand, in the case where the contact angle on the surface of the substrate is lager than that of the gate insulator, since this can be regarded hydrophobic, the pattern of the source and drain electrodes is formed by printing using the conductive material dissolved in an organic solvent. Thus, it is possible to dispose the solution of the conductive material solution for the source and drain electrode in both of the regions of the source electrodes and the drain electrode, and thereby the solution of conductive material is not present to the gate insulator.

Then, the formed solution of the conductive material is transformed into a metal layer. This step adopts solidification by exposure on the side of the surface of the substrate applied with the solution of the conductive material optionally, baking under heating, etc. With the procedure, the source and drain electrode material is repelled from the portion above the gate insulator to enable precise positioning for the gate electrode and the source and drain electrode. Then, a thin organic film transistor is formed, for example, by printing or vapor depositing an organic semiconductor material just above the lower electrode.

While various specific methods are present for preparation with a difference of the hydrophilic property and the hydrophobic property as the property with water between the surface of the gate insulator and the surface of the substrate other than the gate insulator, details will be described later.

The present invention can be practiced by conducting the step of forming the organic semiconductor film and the step of forming the source/drain electrode layer by using metal-nano-particles with no restriction for the order of the steps.

According to the present invention, it is possible to provide a semiconductor device having a thin organic film transistor having an electrode where a lower electrode and an upper electrode positioned accurately are opposed by way of an insulator using a printing method. According to the invention, the positional accuracy described above can be ensured within 1 μm.

BRIEF DESCRIPTION OF THE DRAWINGS

FIGS. 23A and 22B are a plan view and a cross sectional view, respectively, showing in the order of manufacturing steps of a transistor in Example 4 according to the invention;

DETAILED DESCRIPTION OF THE PREFERRED EMBODIMENTS

Figure 1A:
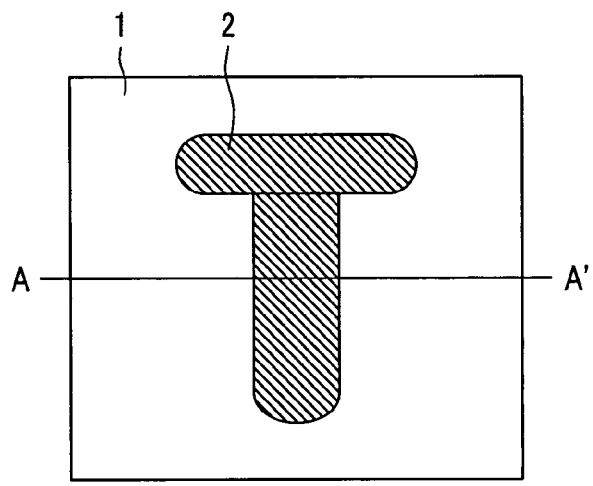
FIGS. 1A and 1B are a plan view and a cross sectional view, respectively, shown in the order of manufacturing steps of a transistor in Example 1 according to the invention.

Prior to specific description of various embodiments of the present invention, principal modes and specific materials to be used of the invention will be described specifically.

First Embodiment

Method of Exposing a Solution Layer for Electrode From the Rear Face of a Substrate Using an Opaque Gate Electrode as a Mask Region As described above, in the first basic embodiment, the ends of the pair of both source and drain electrodes on the side of the gate electrode are set by exposure from the rear face of a substrate using the gate electrode as a mask region. More preferably, the channel portion, the insulator, the gate electrode, and the source and drain electrodes are formed by the printing method.

In this case, the specific procedure for forming the electrode and forming the organic semiconductor film typically includes the following two procedures. At first, the step of forming the organic semiconductor film is applied before the step of forming the electrode material layer. Secondly, the step of forming the organic semiconductor film is applied after the step of forming the electrode material layer.

Further, it is more preferred for attaining the purpose of the invention to conduct each of the step of forming the opaque gate electrode, the step of forming the gate insulator, and the step of forming the electrode material layer at least on the gate insulator by using the printing method.

For the exposure from the rear face of the transparent substrate, it is necessary that the exposure light be at a wavelength associated with the light absorption wavelength of the metal-nano-particles, and a second harmonic wave of an $Nd^{3+}$:YAG laser at 532 nm is a typical example. By the absorption of light, the metal-nano-particles coated as a solution is solidified and transformed to the metal layer. In the case where the size of the metal core is a nano order, it is at scarcely necessary to change the wavelength of the laser light used. While the absorption peak value varies depending on the kind of the metal, since the absorption wavelength is broad (absorption wavelength region is wide), it can be sufficiently covered by 532 nm. Such characteristics do not change irrespective of the presence of absence of the protective film.

Then, specific materials used in the invention, etc will be described.

Typical example for the material of the transparent substrate is silicon compounds or organic compounds. Specific examples of the transparent substrate are glass plates or quartz substrates, or flexible resin sheets, referred to as plastic films. Materials for the plastic film include, for example, polyethylene terephthalate, polyethylene naphthalate, polyether imide, polyether sulfone, polyether ether ketone, polyphenylene sulfide, polyacrylate, polyimide, polycarbonate, cellulose triacetate, and cellulose acetate propionate. The plastic film has a feature of bending flexibly. This is advantageous to various types of applications requiring flexible feature for devices.

The conductive material is inks in the form of superfine particles, complexes, polymers comprising metals, metal oxides or conductive polymer materials dispersible in a solvent to form a liquid material. Metals showing conductivity such as noble metals, for example, platinum, gold, silver and copper, metal oxides showing conductivity such as ITO, and conductive polymers typically represented by polyacetylene and polyaniline can be used. The ink referred to herein suffices metals, metal oxides, or conductive polymers dissolved in solvents which are used usually in the printing step.

The transparent insulator material is organic insulative polymers including, for example, polyimide derivatives, benzocyclobutene derivatives, photoacrylic derivatives, polystyrene derivatives, polyvinyl phenol derivatives, polyester derivatives, polycarbonate derivatives, polyester derivatives, polyvinyl acetate derivatives, polyurethane derivatives, polysulfone derivatives, acrylate resin, acrylic resin, and epoxy resin. In addition, the insulative material may also include inorganic materials such as silicon oxide, silicon nitride, metal oxide, and metal nitride.

The organic semiconductor material includes, for example, polyacene derivatives such as pentacene, polythiophene derivatives, polyethylene vinylene derivatives, polyethylene derivatives, polypyrrole derivatives, polyisothianaphthene derivatives, polyaniline derivatives, polyacetylene derivatives, polydiacetylene derivatives, polyazulene derivatives, polypylene derivatives, polycarabazole derivatives, polyselenophene derivatives, polybenzofuran derivatives, polyphenylene derivatives, polyindole derivatives, polypyridazine derivatives, metallophthalocyanine derivatives, fullerene derivatives, or polymers or oligomers comprising two or more of such repetitive units in admixture. Further, a doping treatment may optionally be applied to such organic semiconductor materials. Further, to improve performance the organic semiconductor transistor, a surface treatment may also be applied to the adhesion surface between the organic semiconductor and the substrate by the step before printing the organic semiconductor. The surface treatment is a treatment forming an SAM film on the surface. Referring to more specific examples, the surface is covered with an organic film (epoxide polybutadiene, etc.) having a film thickness of several nano meter, or the surface is applied with a so-called HMDS.

The solvent for the conductive material is a solvent capable of solving the conductive material and it is possible to use, for example, water, organic solvent such as methyl amyl ketone, ethyl lactate, cyclohexanone, propylene glycol monomethyl ether, photosensitive composition solvent such as propylene glycol-1-monomethyl ether-2-acetate, ethers such as diethyl ether, acetone, and tetrahydrofuran, toluene, and chloroform.

Typical examples of the coating method are an ink jet method, a micro-dispending method, and a transfer method. For the purpose of the invention, it is practical to use at least one method of them for forming various portions.

Typical examples of the first embodiment are set forth below.

(1) A method of manufacturing a semiconductor device having an organic semiconductor film which is a method of manufacturing a thin organic film transistor having, on a substrate, a channel portion constituted with an organic semiconductor, an insulator in contact with the channel portion, a gate electrode in contact with the insulator, and pair of source and drain electrodes spaced apart by the channel portion, and the ends of both of the pair of source and drain electrodes on the side of the gate electrode are arranged within a positional displacement of 1 μm without using photolithography using the photosensitive composition.

(2) A method of manufacturing a semiconductor device having an organic semiconductor film as described in (1) above wherein the substrate and the insulator are transparent, the gate electrode comprises an opaque material, the material for the source and the drain electrodes uses a solution of metal-nano-particles as the starting material, and the ends of both of the pair of source and drain electrodes on the side of the gate electrode are set by the exposure from the rear face of the substrate.

(3) A method of manufacturing a semiconductor device having an organic semiconductor film as described in (2)

above, wherein the channel portion, the insulator, the gate electrode, and the source and drain electrode are formed by a printing method.

(4) A method of manufacturing a semiconductor device having an organic semiconductor film as described in (2) above, wherein the exposure step for setting the ends on the side of the gate electrode of both of the pair of source and drain electrodes includes;

(a) a step of forming an opaque gate electrode on the transparent substrate, (b) a step of forming a gate insulator at least covering the gate electrode, (c) a step of printing a solution of metal-nano-particles including at least a region corresponding to the source and drain electrodes, (d) a step of exposing from the rear side of the transparent substrate thereby preparing electrodes, (e) a step of flushing away the solution of metal-nano-particles at a portion other than the source and drain electrodes after exposure, and (f) a step of forming an organic semiconductor layer for forming the channel portion.

(5) A method of manufacturing a semiconductor device having an organic semiconductor film as described in (1) above, wherein the step of forming the organic semiconductor film is applied after the step of forming the electrode material layer.

(6) A method of manufacturing a semiconductor device having an organic semiconductor film as described in (1) above, wherein the substrate is a flexible substrate.

(7) A method of manufacturing a semiconductor device having an organic semiconductor film as described in (1) above, wherein the substrate comprises a silicon compound.

(8) A method of manufacturing a semiconductor device having an organic semiconductor film as described in (1) above, wherein the substrate comprises an organic compound.

(9) A method of manufacturing a semiconductor device having an organic semiconductor film as described in (2) above, wherein the exposure light from the rear face of the transparent substrate is at a wavelength of light absorption of the metal-nano-particles.

(10) A method of manufacturing a semiconductor device having an organic semiconductor film as described in (2) above, wherein the exposure light is laser light.

(11) A method of manufacturing a semiconductor device having an organic semiconductor film as described in (2) above, wherein the exposure light is a second harmonic wave of an $Nd^{3+}$: YAG laser.

(12) A method of manufacturing a semiconductor device having an organic semiconductor film as described in (2) above, wherein the metal-nano-particles structure has a metal at the center and the organic compound is present so as to cover the metal. As described above, the metal core comprises a noble metal such as platinum, gold, silver, and copper, and the organic material is a thiol compound, a compound having a carboxylic group and a compound having an amino group.

(13) A method of manufacturing a semiconductor device having an organic semiconductor film as described in (1) above, wherein the coating method is at least one type selected from an ink jet method, a micro-dispensing method and a transfer method.

(14) A method of manufacturing a semiconductor device having an organic semiconductor film as described in (2) above, wherein the exposure light is set to such an irradiation dose as capable of forming the source and drain electrodes overriding the connection between the gates. In this case, a dose of about 10 to 50 $J/cm^2$ is used for solidifying the metal-nano-particles.

Second Embodiment

Method of Utilizing the Difference of Property to the Coating Solution Between the Gate Insulator and the Surface of the Substrate The second embodiment provides a method of manufacturing a semiconductor device having a thin organic film transistor having, on a substrate, a channel portion comprising an organic semiconductor, an insulator in contact with the channel portion, a gate electrode in contact with the insulator, and a pair of source and drain electrodes spaced apart by the channel portion, in which the property with a liquid, that is, whether it is hydrophilic or hydrophobic is made different between the surface of the substrate and the surface of the gate insulator from each other, so that the solution of the source electrode and the drain electrode materials are repelled selectively from a portion on the gate insulator, and the ends of both of the pair of source and drain electrodes on the side of the gate electrode are set.

The material for the surface of the substrate and the material for the surface of the gate insulator are formed of different substances. In the case where the difference in the contact angle with water is small, there are also a method of treating either the surface of the substrate or the surface of the gate insulator selectively with a self-assembled monolayer (hereinafter simply referred to as an SAM film), or a method of changing the contact angle of the surface with water by coating a polymeric film previously on the surface of the substrate. The contact angle is an angle formed between a liquid and a solid surface (an angle inside the liquid) at a place where the free surface of a stationary liquid is in contact with a solid wall.

Also in the second embodiment of the invention, the transparent substrate, the conductive material, the transparent insulator material, the organic semiconductor material, etc. described above can also be used. In the second embodiment, while the substrate side is not necessarily used as a transparent or transparent insulator, an identical material may also be used.

Also the coating method for the conductive material is identical with that described for the first embodiment.

The SAM material is typically a compound having a silane coupling agent on the terminal end.

The SAM material is, for example, a compound having a silane coupling agent on the terminal end. In the case where the surface is a metal oxide or $SiO_2$, a silane coupling agent is a typical example. In the case where the surface is a noble metal such as platinum, gold, silver, or copper, the material is a thiol compound, a compound having a carboxyl group and an amino group.

There are various methods to provide the surface of the gate insulator and the region forming both of the pair of source and drain electrodes with the hydrophilic property or hydrophobic property. Various kinds of examples based on the method are to be set forth below.

(1) A method of manufacturing a semiconductor device having an organic semiconductor film which is a method of manufacturing a thin organic film transistor having, on a substrate, a channel portion constituted with an organic semiconductor, an insulator in contact with the channel portion, a gate electrode in contact with the insulator, and pair of source and drain electrodes spaced apart by the channel portion, wherein the material for the surface of the substrate and the material for the surface of the gate insulation film are formed of different materials, the difference of the contact angle with water is 300 or more and, preferably, 600 or more, the pair of source and drain electrodes are formed by using the conductive material in the state of a solution as the starting material, by a coating method and the ends of both of the pair of source and drain electrode on the side of the gate electrode are arranged in a positional displacement within 1 μm not using photolithography using the photosensitive composition. (2) A method of manufacturing a semiconductor device having an organic semiconductor film including:

(a) a step of forming a gate electrode on a substrate, (b) a step of forming a gate insulator covering the gate electrode, (c) a step of forming a layer containing metal-nano-particles in a region of a source electrode and a drain electrode above the thus prepared substrate, (d) a step of transforming the layer containing the metal-nano-particles into a metal layer, and (e) a step of forming an organic semiconductor layer covering at least the gate insulator, (f) conducting the step of forming the layer containing the metal-nano-particles after attaining a state where the property of the region of the source electrode and the drain electrode and the property of the region other than the source electrode and the drain electrode are contrary to each other regarding the hydrophilic property and the hydrophobic property, and (g) using a water soluble solution of metal-nano-particles in the case where the surface of the substrate is hydrophilic and a water insoluble solution of metal-nano-particles in the case where the surface of the substrate is hydrophobic regarding the hydrophilic property and hydrophobic property on the surface of the substrate.

The hydrophilic substrates include the followings. That is, they are cellulose derivatives, dihydroxy styrene derivatives, novolac derivatives, polyvinyl alcohol derivatives, vinylone, and hydroxy acrylate derivatives.

Organic materials used for ensuring the hydrophobic property include the following materials. That is, they are polyimide derivatives, benzo cyclobutene derivatives, photo acryl derivatives, polystyrene derivatives, polyvinyl phenol derivatives, polyester derivatives, polycarbonate derivatives, polyester derivatives, polyvinyl acetate derivatives, polyurethane derivatives, polysulfone derivatives, acrylate resins, acrylic resins, and epoxy resins.

Typical examples of the solution used for forming the electrode include the followings. Hydrophilic solutions include an aqueous solution of metal-nano-particles (fine nano particles having, for example, protective film of citric acid), an alcohol solution of metal-nano-particles (metal-nano-particles having, for example, protective film of a thiol compound having amino group). On the other hand, the hydrophobic solutions can include the followings. They are a toluene solution of metal-nano-particles (metal-nano-particles having, for example, a protective film of thiol compound), or a chloroform solution, ether solution, conductive polymers of metal-nano-particles.

(3) The difference of the contact angle with water between the hydrophobic region and the hydrophilic region is practically 30° or more.

(4) This example is a method of rendering the $SiO_2$ film hydrophilic in the S/D electrode forming region and the gate insulator hydrophilic. That is, this is a method including:

(a) a step of forming a gate electrode on a substrate having a surface comprising $SiO_2$, (b) a step of forming a gate insulator covering the gate electrode, (c) a step of rendering the $SiO_2$ film hydrophobic in the region other than the region covered with the gate insulator, (d) a step of forming a water insoluble layer containing metal-nano-particles in a region of a source electrode and a drain electrode on the thus prepared substrate, and (e) a step of forming an organic semiconductor layer at least covering the gate insulator.

The gate insulator is often formed of a metal oxide and can be said hydrophilic compared with the region other than the region covered with the gate insulator. Accordingly, when a layer for the source/drain electrode is coated by using a water insoluble solution containing metal-nano-particles, the solution is repelled to form a layer of the solution in the source/drain electrode regions.

(5) For the characteristic after the hydrophobic treatment of the $SiO_2$ film, it is practical that the difference between the contact angle with water in the region covered with the gate insulator and the contact angle with water in the $SiO_2$ film other than the region covered with the gate insulator is 300 or more. The difference of the contact angle is, more preferably, 60° or more.

(6) A method of using a thin organic film for rendering the $SiO_2$ film hydrophobic The step of rendering the $SiO_2$ film hydrophobic in the region other than the region covered by the gate insulator forms a hydrophobic thin organic film in the region of the $SiO_2$ film.

(7) A method of using an SAM upon rendering the $SiO_2$ film hydrophobic

The step of rendering the $SiO_2$ film hydrophobic in the region other than the region covered with the gate insulator forms an SAM film in the region of the $SiO_2$ film.

(8) A method of rendering the surface hydrophobic in the case where the surface of the substrate comprises a hydrophilic organic compound The method includes:

(a) a step of forming a gate electrode on a substrate where the surface is a hydrophilic thin organic film, (b) a step of forming a gate insulator covering the gate electrode, (c) a step of rendering the region hydrophobic in the region other than the region covered with the gate insulator, (d) a step of forming a water insoluble layer containing metal-nano-particles in the region of a source electrode and a drain electrode on the thus prepared substrate, (e) a step of transforming the layer contain the metal-nano-particles into a metal layer and (f) a step of forming an organic semiconductor layer covering at least the gate insulator.

(9) A method of using a thin organic material film for rendering the surface of the substrate hydrophobic in the case where the surface comprises a hydrophilic organic compound This is a method in which the step of rendering the region other than the region covered with the gate insulator hydrophobic forms a hydrophobic thin organic film in the region other than the region covered with the gate insulator.

(10) A method of using an SAM for rendering the surface of the substrate hydrophobic in the case where the surface comprises a hydrophilic organic compound This is a method in which the step of rendering the region other than region covered with the gate insulator hydrophobic forms a self-assembled monolayer (SAM) in the region other than the region covered with the gate insulator.

(11) A step of forming a hydrophobic gate insulator to a substrate where the surface comprises a hydrophilic organic compound This is a method of manufacturing a semiconductor device having an organic semiconductor film including;

(a) a step of forming a gate electrode on a substrate where the surface comprises a hydrophilic thin organic material film, (b) a step of forming a gate insulator covering the gate electrode, (c) a step of rendering the region covered with the gate insulator hydrophobic, (d) a step of forming a water soluble layer containing metal-nano-particles in the region of the source electrode and the drain electrode on the thus prepared substrate, (e) a step of transforming the layer containing the metal-nano-particles into a metal layer, and (f) a step of forming an organic semiconductor layer covering at least the gate insulator.

A typical method of rendering the region covered with the gate insulator hydrophobic is to form an SAM.

(12) A step of using a hydrophilic gate insulator for a substrate where the surface comprises a hydrophobic organic compound This is a method of manufacturing a semiconductor device having an organic semiconductor film including:

(a) a step of forming a gate electrode on a substrate where the surface comprises a hydrophobic organic compound, (b) a step of forming a hydrophilic gate insulator on the gate electrode, (c) a step of forming a water insoluble layer containing metal-nano-particles in the region of the source electrode and the drain electrode on the thus prepared substrate, (d) a step of transforming the layer containing metal-nano-particles into a metal layer and, (e) a step of forming an organic semiconductor layer covering at least the gate insulator.

Typical examples of the coating method for the solution containing the metal-nano-particles include an ink jet method, a micro-dispenser method, transfer method, etc. For the purpose of the invention, it is practical to use at least one of them for forming various portions.

(13) A method of manufacturing a semiconductor device having an organic semiconductor film having, on a substrate, a channel portion comprising an organic semiconductor, an insulator in contact with the channel portion, a gate electrode in contact with the insulator, and a pair of source and drain electrodes spaced apart by the channel portion, in which the material for the source and drain electrodes is a metal-nano-particles and the ends and the counter ends on the side of the gate electrode of both of the pair of source and drain electrodes are set by the patternwise exposure from the surface of the substrate.

(14) A method of manufacturing a semiconductor device having an organic semiconductor film described in (13) above, wherein the channel portion, the insulator, the gate electrode, and the source and drain electrodes are formed by a printing method.

(15) A method of manufacturing a semiconductor device having an organic semiconductor film described in (13) above, wherein the exposing step for setting the ends on the side of the gate electrode of the both of the pair of source and drain electrodes includes:

a step of forming a gate electrode on a substrate, a step of forming a gage insulator covering at least the gate electrode, a step of printing a solution of metal-nano-particles including at least the region corresponding to the source and drain electrodes, a step of patternwise exposing from the upper surface of the substrate thereby preparing an electrodes, a step of flushing away a solution of metal-nano-particles in the region other than the source and the drain electrodes after the exposure and a step of forming an organic semiconductor layer for forming the channel portion.

(16) A method of manufacturing a semiconductor device having an organic semiconductor film as described in (13) above, wherein the exposure light from the surface of the substrate is at a wavelength of light absorption of the metal-nano-particles.

(17) A method of manufacturing a semiconductor device having an organic semiconductor film as described in (13) above, wherein the exposure light is laser light.

(18) A method of manufacturing a semiconductor device having an organic semiconductor film as described in (13) above, wherein the exposure light is a second harmonic wave of an $Nd^{3+}$:YAG laser.

(19) A method of manufacturing a semiconductor device having an organic semiconductor film as described in (13) above, wherein the metal-nano-particle structure has a metal at the center and the organic compound is present so as to cover the metal.

(20) A method of manufacturing a semiconductor device having an organic semiconductor film as described in (13) above, wherein the exposure light is set to such an irradiation dose as capable of forming the source and drain electrodes overriding the connection between the gates.

(21) In the various examples described above, description has been made by using an embodiment in which the $SiO_2$ film or the organic compound film is formed over the entire surface of the substrate. However, the gist of the present invention is that the material is different between the surface of the substrate and the surface of the gate insulator formed thereover and that the property relative to the liquid is different. Accordingly, the material below the gate electrode is not restricted basically. Therefore, rendering the property to the liquid different between the gate insulator and the region other than the gate insulator does not always require to form the $SiO_2$ film or the organic compound film over the entire surface of the substrate, and a region of a desired characteristic may of course be formed partially.

Then, several examples of the invention will be described specifically. In the example, since the ink jet printing apparatus had both the positional accuracy and the minimum value for drawn line of which are both 20 µm, the gate electrode line width was set to 20 µm.

EXAMPLE 1

FIGS. 1A and 1B to FIGS. 8A and 8B are plan views and cross sectional views, respectively, of a device in the order of manufacturing steps of this example for forming source and drain electrodes by exposure from the rear face of a substrate. In each of FIGS. 1A and 1B to FIGS. 8A and 8B, (A) is an upper plan view and (B) is a cross sectional view along line A-A' in (A). In the upper plan view and the cross sectional view of the device shown in the order of the manufacturing steps in the present specification, (A) is an upper plan view and (B) is a cross sectional view in each of the drawings.

Figure 1B:
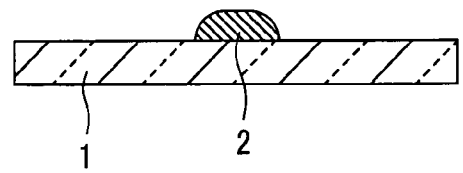

A gate electrode shape having a line width of 20 µm was printed by using polyethylene terephthalate as an organic compound for a transparent substrate 1 and using gold-nanoparticles dispersed in a toluene solution as an ink by an ink jet printing method to form a gold gate electrode 2 by over heating at 120° C. for 5 min (upper plan view: FIG. 1A, and cross sectional view: FIG. 1B). The height of prepared gate electrode was about 10 μm. The grain size of the metal nuclei of the gold-nano-particles was 3.5 nm and the periphery of the metal nuclei is covered with butane thiolate. The gold gate electrode 2 in the upper plan view of FIG. 1A had a T-shaped configuration and drawn as being divided into two parts, that is, a longitudinal portion and a lateral portion. In the gold gate electrode 2, they integrally constituted a gate electrode portion. Accordingly, it is optional whether the T-shaped configuration is formed integrally or formed by at least two portions and the manufacturing method therefor is sometimes suitable and sometimes not suitable. In the ink jet printing of this example, it is more suitable to constitute the same by scanning while dividing the same into two portions. On the other hand, in a case, for example, of a transfer method, it is advantageous to conduct transfer for the T-shape integrally. Situation is identical in each of the following upper plan views, for example, FIG. 2A, FIG. 3A, FIG. 4A, FIG. 5A and FIG. 6A (all drawing number are not always exemplified) and they are drawn such that they are parted into two portions in the drawing.

Figure 2A:
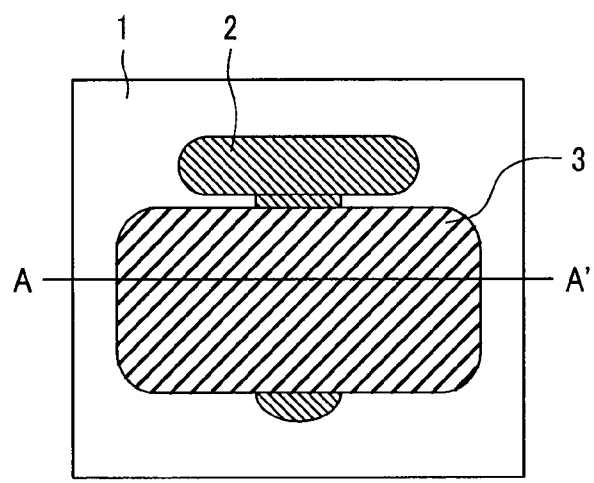
FIGS. 2A and 2B are a plan view and a cross sectional view, respectively, shown in the order of manufacturing steps of a transistor in Example 1 according to the invention.
Figure 2B:
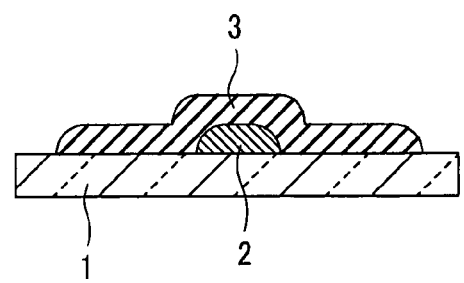
Figure 3A:
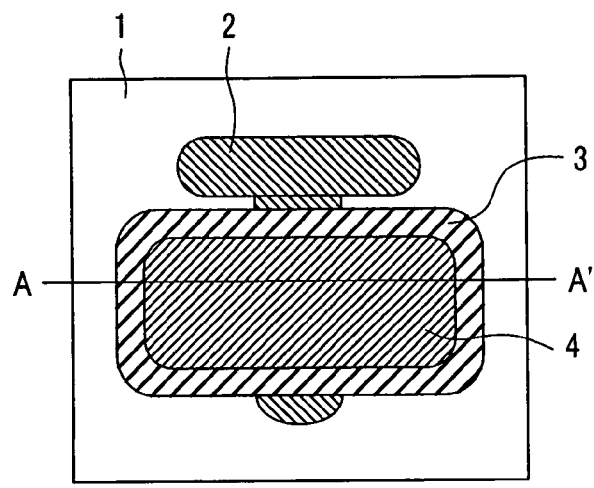
FIGS. 3A and 3B are a plan view and a cross sectional view, respectively, shown in the order of manufacturing steps of a transistor in Example 1 according to the invention.
Figure 3B:
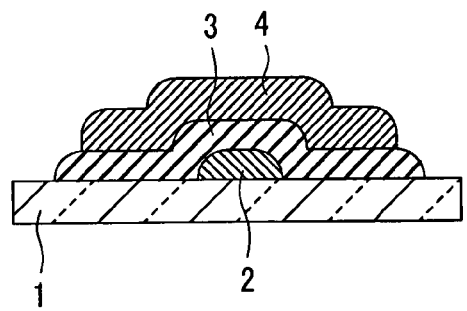

Then, a gate insulator shape was formed with a 10% N-methyl pyrrolidone solution of a polyimide by an ink jet printing method, which was annealed at 150° C. for 20 min to form a gate insulator 3 on a necessary portion (upper plan view: FIG. 2A, cross sectional view: FIG. 2B). The thickness of the gate insulator was about 100 nm. Further, taking into consideration the positional displacement, the gate insulator 3 was patterned larger by about 20 μm than the width of a source/drain electrode to be formed subsequently (upper plan view: FIG. 3A, cross sectional view: FIG. 3B). A 10 wt % toluene solution 4 of metal-nano-particles was printed thereover by an ink jet method. In consideration for the printing displacement of 20 μm, the printing pattern was formed larger by 30 μm than the gate insulator. The thickness of the photosensitive composition was about 15 μm.

Figure 4A:
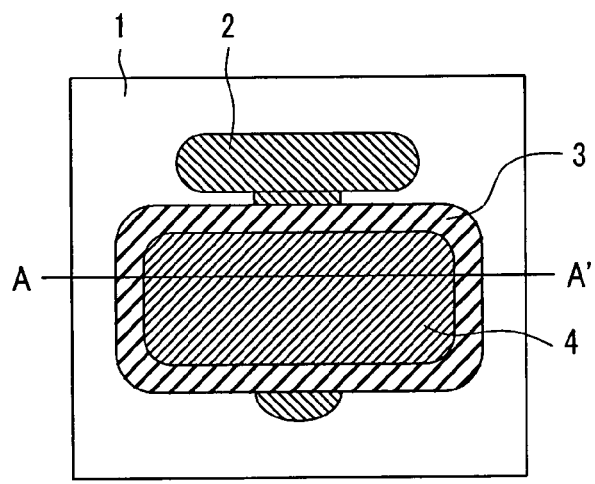
FIGS. 4A and 4B are a plan view and a cross sectional view, respectively, shown in the order of manufacturing steps of a transistor in Example 1 according to the invention.
Figure 4B:
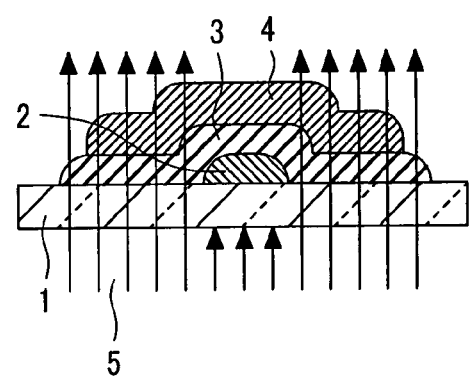
Figure 5A:
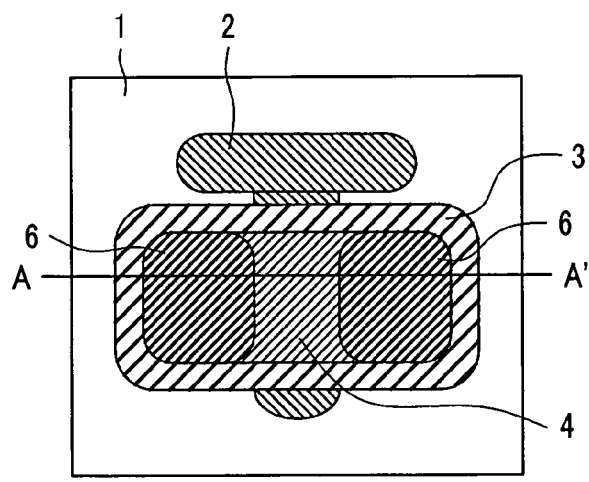
FIGS. 5A and 5B are a plan view and a cross sectional view, respectively, shown in the order of manufacturing steps of a transistor in Example 1 according to the invention.
Figure 5B:
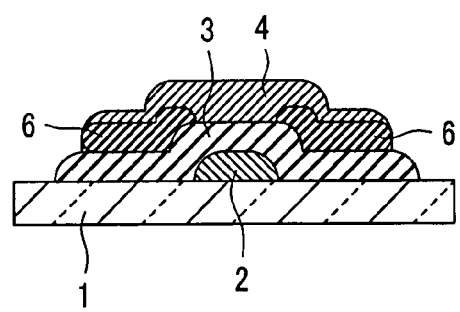
Figure 6A:
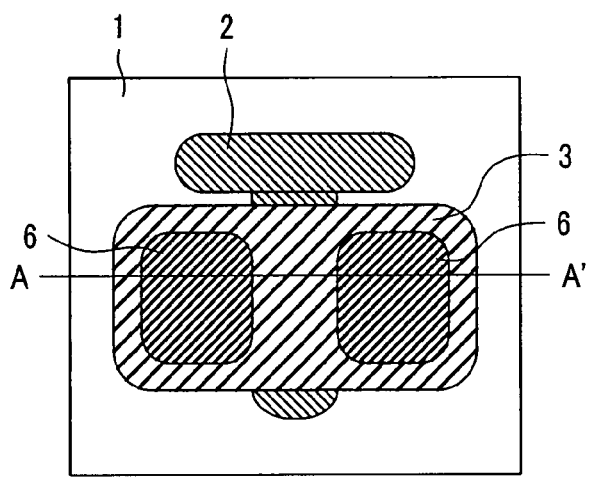
FIGS. 6A and 6B are a plan view and a cross sectional view, respectively, shown in the order of manufacturing steps of a transistor in Example 1 according to the invention.
Figure 6B:
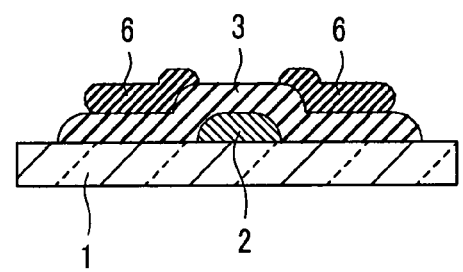

Exposure was performed from the rear face of the substrate for 120 sec by using the second harmonic wave 5 (532 nm) of an $Nd^{3+}$:YAG laser (upper plan view: FIG. 4A, cross sectional view: FIG. 4B). It can be seen that metal-nano-particles are solidified and secured by exposure as shown by 6 (upper plan view: FIG. 5A, cross sectional view: FIG. 5B). Then, cleaning was applied with toluene for 90 sec. A metal pattern (source and drain electrode) 6 was formed so as to dodge the gate electrode 2 (upper plan view: FIG. 6A, cross sectional view: FIG. 6B). The thickness of the metal pattern 6 was about 5 μm. The positional displacement between the gate electrode, and the source and drain electrode was 0.5 μm at this instance.

Figure 7A:
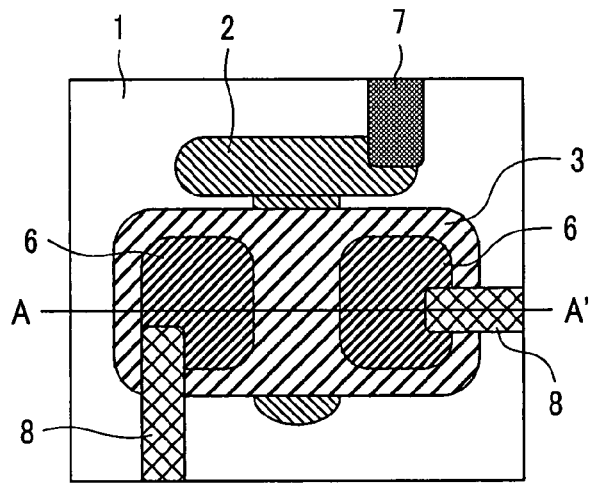
FIGS. 7A and 7B are a plan view and a cross sectional view, respectively, shown in the order of manufacturing steps of a transistor in Example 1 according to the invention.
Figure 7B:
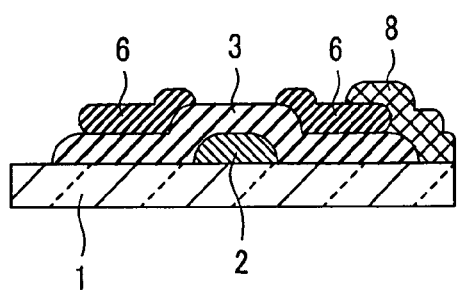
Figure 8A:
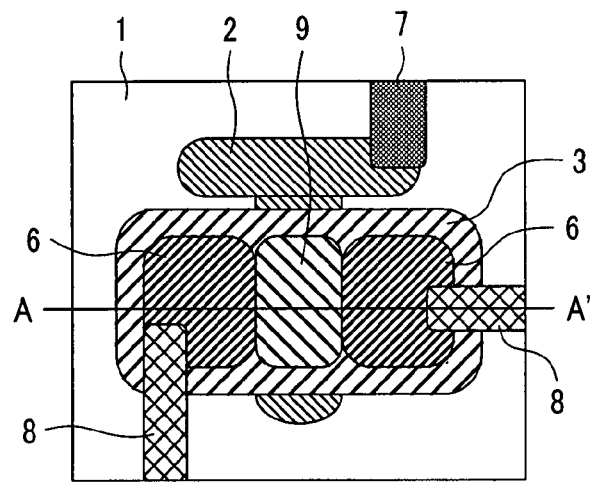
FIGS. 8A and 8B are a plan view and a cross sectional view, respectively, shown in the order of manufacturing steps of a transistor in Example 1 according to the invention.
Figure 8B:
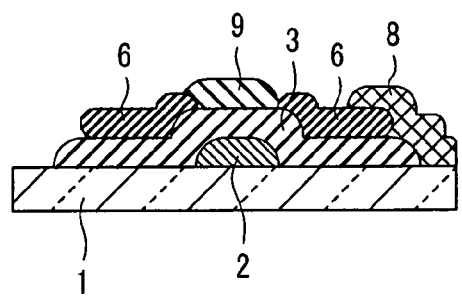

Then, a wiring 7 and a wiring 8 were printed by using the same toluene solution of gold-nano-particles as in the gate electrode by an ink jet printing method and annealed at 120° C. for 5 min (upper plan view: FIG. 7A, cross sectional view: FIG. 7B). The thickness of the wiring at this instance was 0.5 μm. Then, a channel portion 9 was printed between the source electrode 6 and the drain electrode 6 just above the gate electrode 2 by using a 5% chloroform solution of an organic semiconductor (poly (3-hexylthiophene-2,5-diyl) Regio-regular) by an ink jet printing method and annealed at 180° C. for 2 min (upper plan view: FIG. 8A, cross sectional view: FIG. 8B). The thickness of the channel portion 9 was 15 μm.

When the mobility of the transistor was determined, it was 0.1 $cm^2$/Vs. The value shows the characteristic of the thin organic film transistor, which means that there was no positional displacement between both of upper and lower electrodes to each other.

Formation of the insulator 3 and the organic semiconductor layer 9 can also be performed by rotary coating. The mobility of the thin organic film transistor by the rotary coating method was identical. However, the printing method described above is advantageous since it results in no wasteful loss for the amount of use of each solution compared with the case of formation by the rotary coating.

EXAMPLE 2

Figure 9:
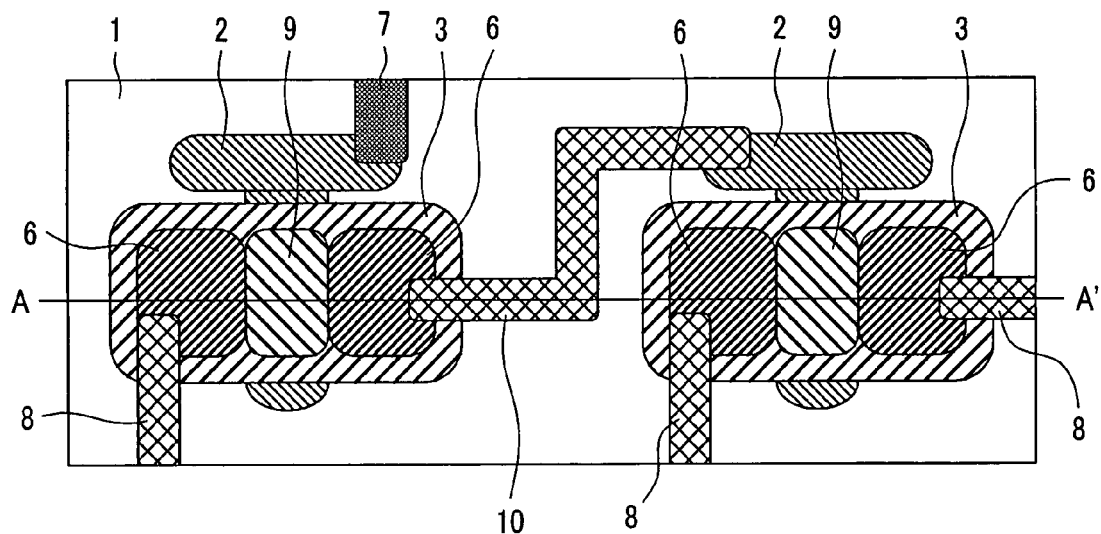
FIG. 9 is a plan view and a cross sectional view shown in the order of manufacturing steps of a semiconductor device having a transistor in Example 2 according to the invention.
Figure 10:
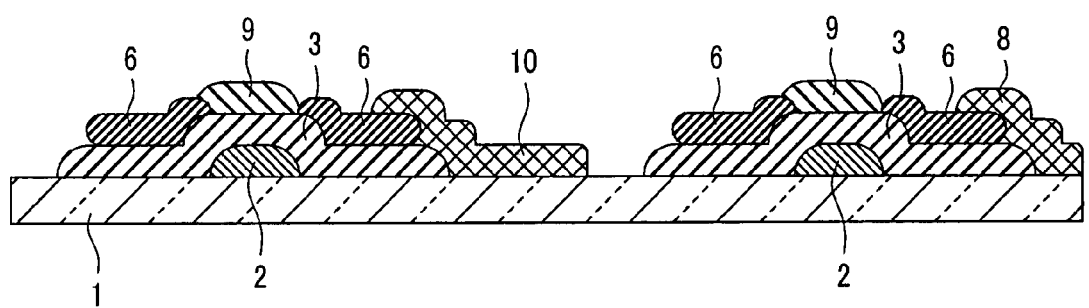
FIG. 10 is a plan view and a cross sectional view shown in the order of manufacturing steps of a semiconductor device having a transistor in Example 2 according to the invention.

This is a case of forming two organic semiconductor transistors (19, 20) based on the same method as in Example 1. FIG. 9 and FIG. 10 show an upper plan view and a cross sectional view of this example. While the method of forming each transistor is identical with that in Example 1 described above, a drain electrode 6 of a first transistor 19 was connected with a second gate electrode 2 of the other transistor 20 by way of a wiring 10 after forming each of the transistors. FIG. 9 shows an upper plan view and FIG. 10 shows a cross sectional view along cross section A-A' in FIG. 9. The performances of both of the transistors were quite identical and transistors with no fluctuation in the performance could be prepared.

EXAMPLE 3

FIG. 11 to FIG. 18 show a method of manufacturing an organic semiconductor TFT in the case where the difference of contact angle with water is large between the surface of the substrate and the surface of the gate insulator.

Figure 11A:
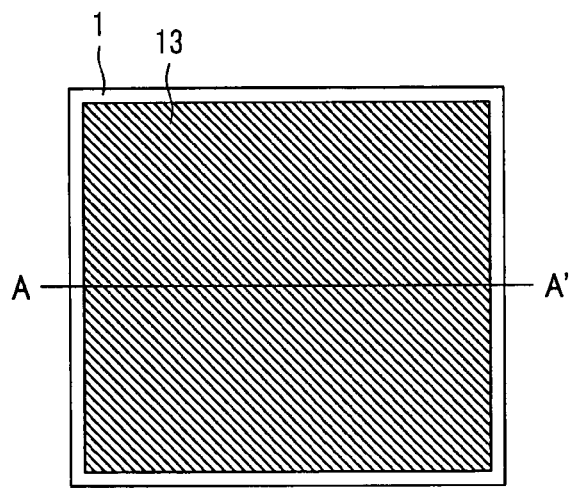
FIGS. 11A and 11B are a plan view and a cross sectional view, respectively, showing in the order of manufacturing steps of a transistor in Example 3 according to the invention.
Figure 11B:
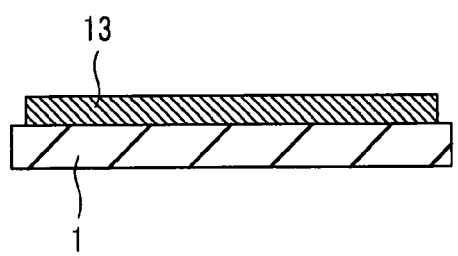
Figure 12A:
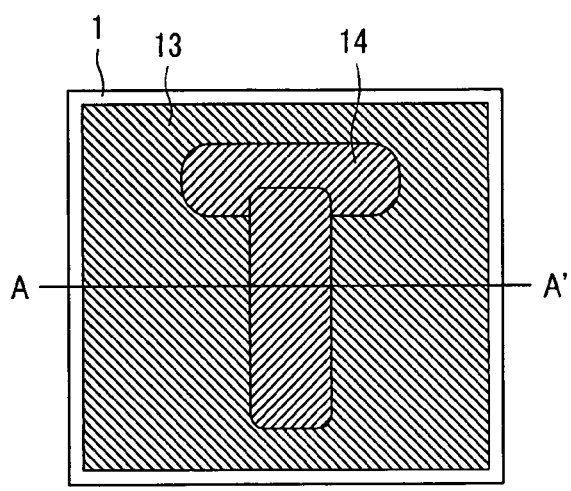
FIGS. 12A and 12B are a plan view and a cross sectional view, respectively, showing in the order of manufacturing steps of a transistor in Example 3 according to the invention.
Figure 12B:
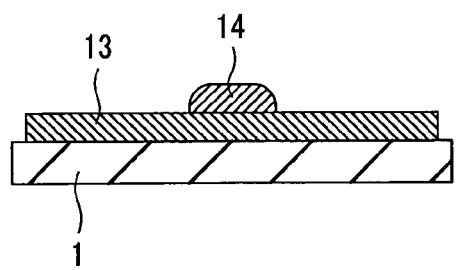
Figure 13A:
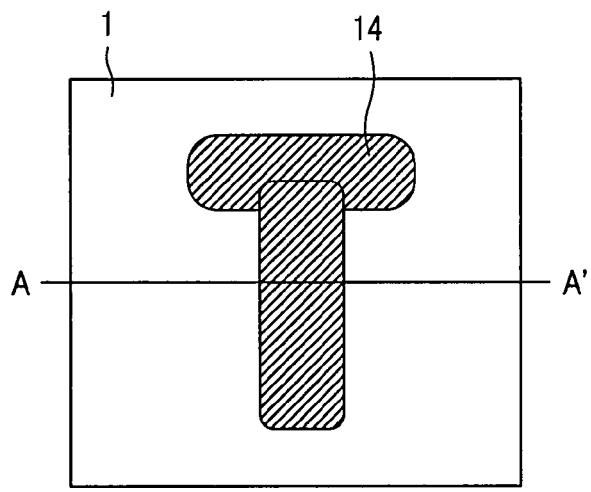
FIGS. 13A and 13B are a plan view and a cross sectional view, respectively, showing in the order of manufacturing steps of a transistor in Example 3 according to the invention.
Figure 13B:
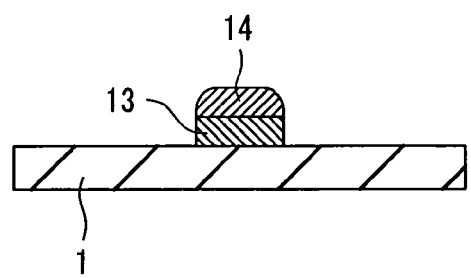
Figure 14A:
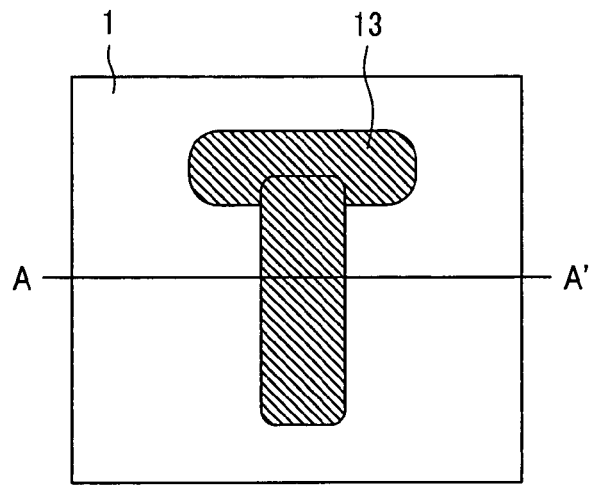
FIGS. 14A and 14B are a plan view and a cross sectional view, respectively, showing in the order of manufacturing steps of a transistor in Example 3 according to the invention.
Figure 14B:
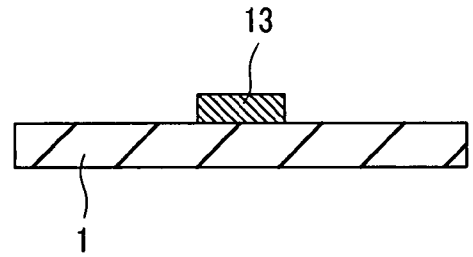

An aluminum film 13 was formed by sputtering on the same polyethylene terephthalate substrate 1 as in Example 1 (upper plan view: FIG. 11A, cross sectional view: FIG. 11B). Further, a 20 wt % methyl amyl ketone solution of a novolac resin was coated thereover in a desired gate electrode shape by a printing method (upper plan view: FIG. 12A, cross sectional view: FIG. 12B). The gate size was made identical with that in Example 1. Aluminum was wet etched by using an aqueous solution of phosphoric acid, nitric acid, and acetic acid using the novolac resin pattern as a mask (upper plan view: FIG. 13A, cross sectional view: FIG. 13B). Successively, the novolac resin was cleaned with acetone, to obtain a gate pattern 13 (upper plan view: FIG. 14A, cross sectional view: FIG. 14B).

Figure 15A:
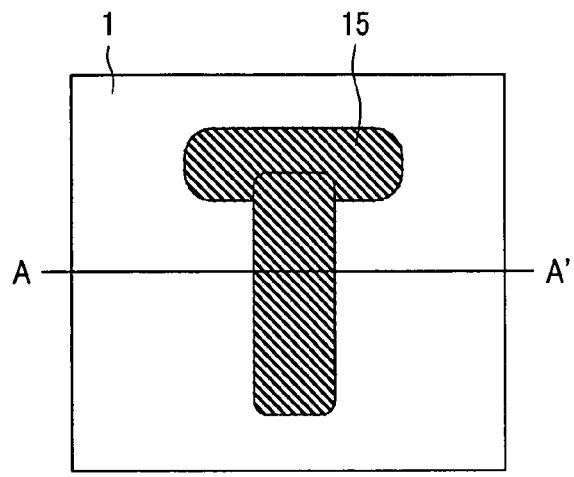
FIGS. 15A and 15B are a plan view and a cross sectional view, respectively, showing in the order of manufacturing steps of a transistor in Example 3 according to the invention.
Figure 15B:
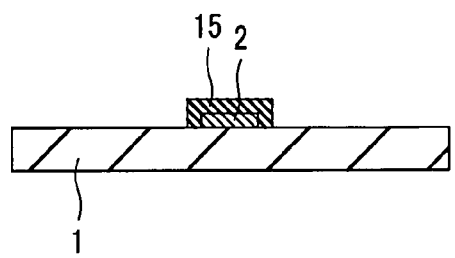

Then, the aluminum pattern 13 was anodized to form an aluminum oxide (alumina) film 15 on the surface (upper plan view: FIG. 15A, cross sectional view: FIG. 15B). The thickness of the alumina film 15 was set to 10 nm. At this instance, the contact angle of the surface of the substrate 1 with water was 90° and the contact angle of the alumina film as the gate insulator was 25°.

Figure 16A:
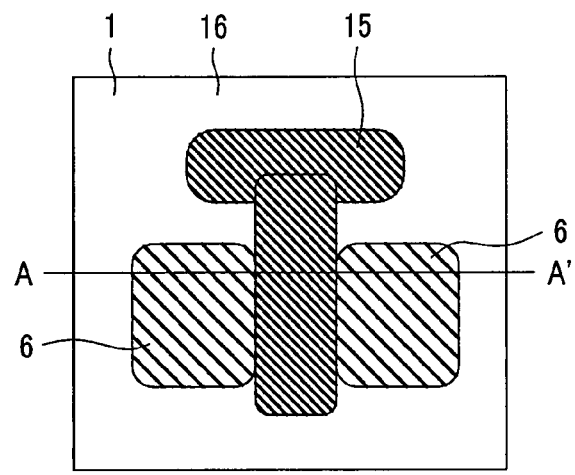
FIGS. 16A and 16B are a plan view and a cross sectional view, respectively, showing in the order of manufacturing steps of a transistor in Example 3 according to the invention.
Figure 16B:
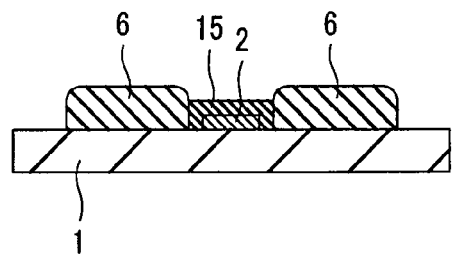
Figure 17A:
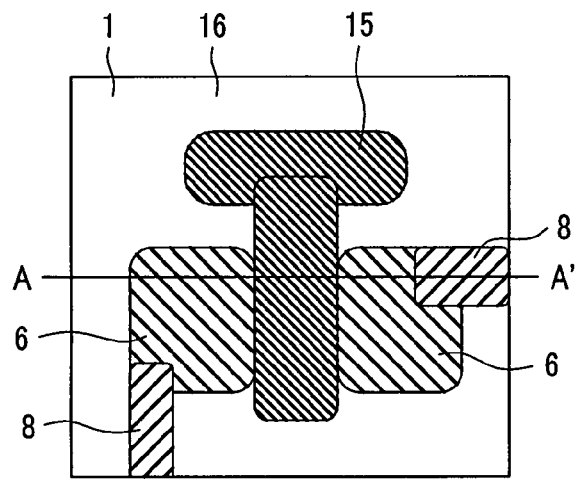
FIGS. 17A and 17B are a plan view and a cross sectional view, respectively, showing in the order of manufacturing steps of a transistor in Example 3 according to the invention.
Figure 17B:
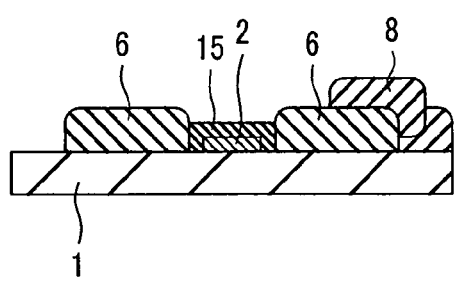

Successively, source and drain electrode 6 were formed by using the same toluene solution of gold-nano-particles as in the gate preparation of Example 1 at a desired position by a printing method (upper plan view: FIG. 16A, cross sectional view: FIG. 16B). Since the toluene solution was used, the solution of the metal-nano-particles was not deposited on the alumina film 15 as the gate insulator. A wiring 8 was formed by the printing of a toluene solution of the same metal-nano-particles as in the formation of the source and drain electrodes (upper plan view: FIG. 17B, cross sectional view: FIG. 17B). The film thickness of the source and gate electrodes and the wiring 8 after baking at 120° C. for 5 min was about 5 μm. The positional displacement between the gate electrode and the source and the drain electrodes was 0.2 µm at this instance.

Figure 18A:
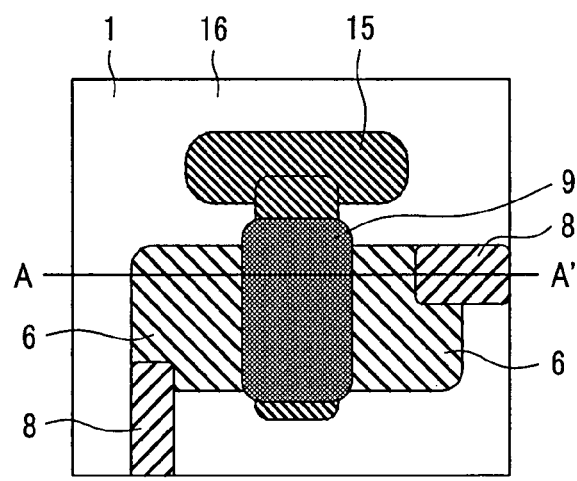
FIGS. 18A and 18B are a plan view and a cross sectional view, respectively, showing in the order of manufacturing steps of a transistor in Example 3 according to the invention.
Figure 18B:
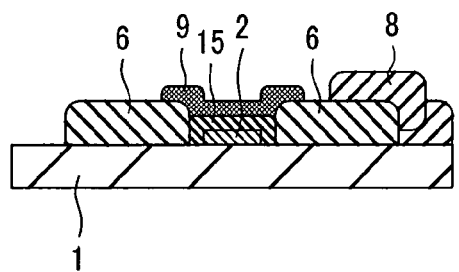

Then, a channel portion 9 was printed by using a 5% chloroform solution of an organic semiconductor (poly(3-hexylthiophene-2,5-diyl) Regioregular) between the source and drain electrodes 6 just above the gate electrode 2 by an ink jet printing method and annealed at 180° C. for 2 min (upper plan view: FIG. 18A, cross sectional view: FIG. 18B). The thickness of the channel portion 9 was 15 µm.

When the mobility of the transistor was determined, it was 0.12 cm$^2$/Vs. The value shows the characteristics of the thin organic film transistor which is considered to be free of positional displacement between both of upper and lower electrodes to each other.

EXAMPLE 4

This example shows a step of preparing an organic TFT in the case where the difference of the contact angle with water between the surface of the substrate and the surface of the gate insulator is 30° or less.

Figure 19A:
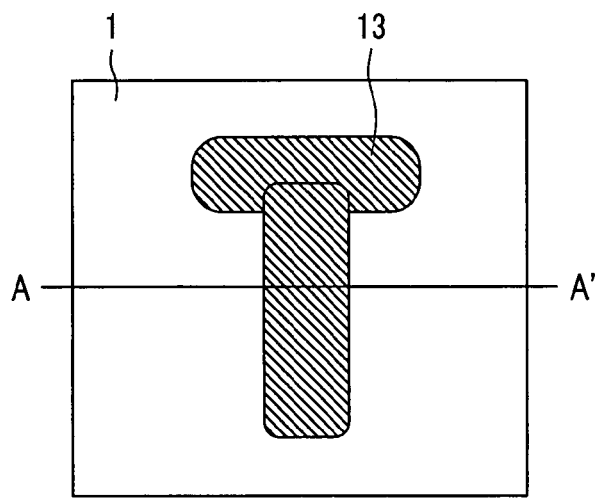
FIGS. 19A and 19B are a plan view and a cross sectional view, respectively, showing in the order of manufacturing steps of a transistor in Example 4 according to the invention.
Figure 19B:
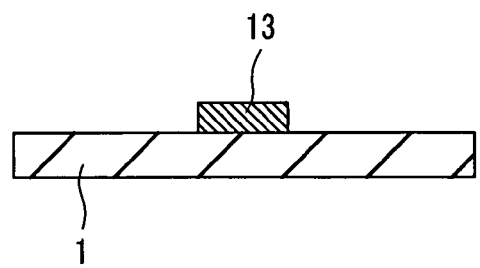
Figure 20A:
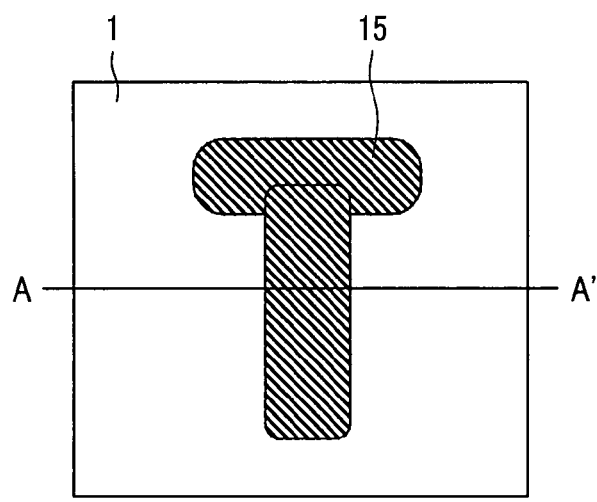
FIGS. 20A and 20B are a plan view and a cross sectional view, respectively, showing in the order of manufacturing steps of a transistor in Example 4 according to the invention.
Figure 20B:
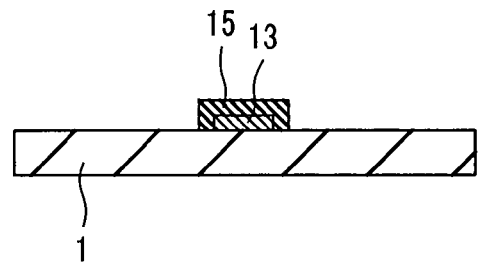
Figure 21A:
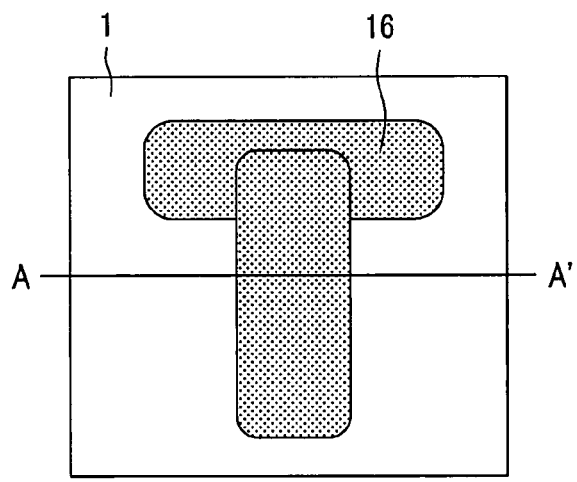
FIGS. 21A and 21B are a plan view and a cross sectional view, respectively, showing in the order of manufacturing steps of a transistor in Example 4 according to the invention.
Figure 21B:
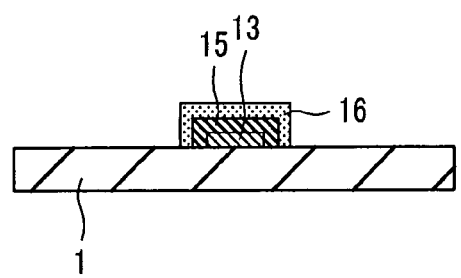
Figure 22A:
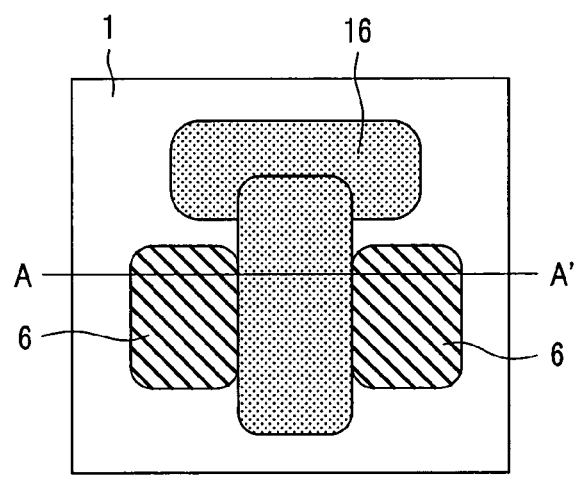
FIGS. 22A and 22B are a plan view and a cross sectional view, respectively, showing in the order of manufacturing steps of a transistor in Example 4 according to the invention.
Figure 22B:
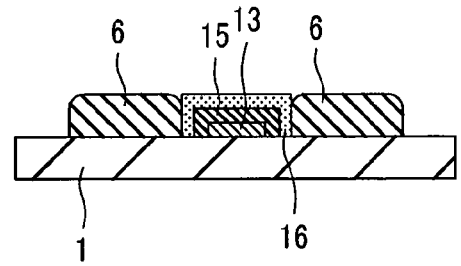
Figure 23A:
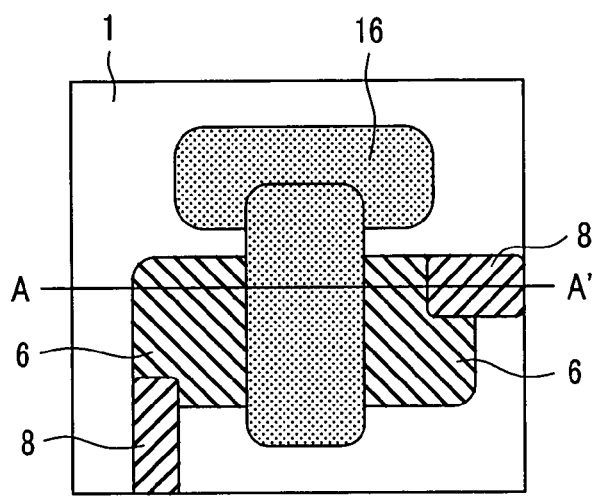
Figure 23B:
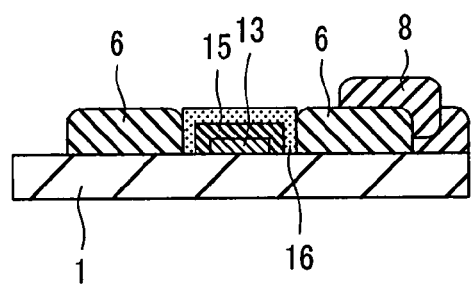
Figure 24A:
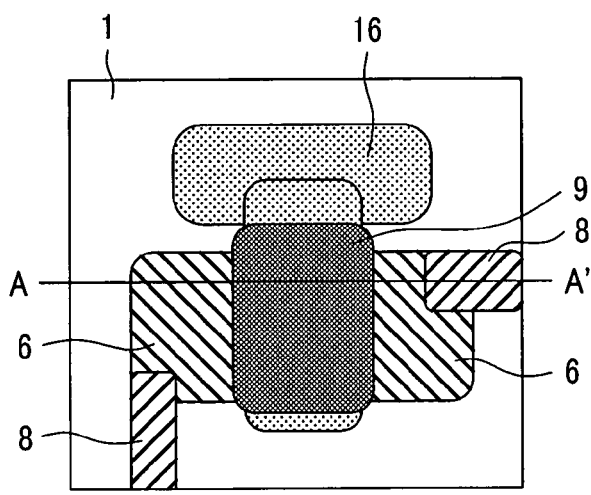
FIGS. 24A and 24B are a plan view and a cross sectional view, respectively, showing in the order of manufacturing steps of a transistor in Example 4 according to the invention.
Figure 24B:
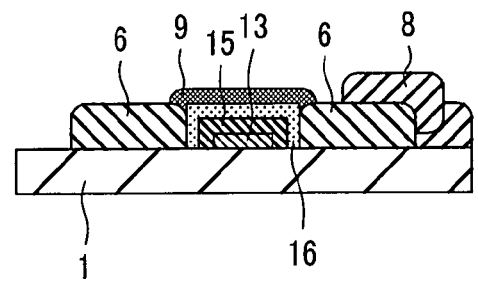

Fundamental manufacturing steps are identical with those in Example 3 except for using cellulose triacetate for a substrate 1 and forming an SAM on a gate insulator. A gate 2 was formed on a cellulose triacetate substrate 1 (upper plan view: FIG. 19A, cross sectional view: FIG. 19B), and a gate insulator 15 was formed (upper plan view: FIG. 20A, cross sectional view: FIG. 20B). At this instance, the contact angle of the surface of the substrate 1 with water was 50 degree and the contact angle of the alumina film 15 as the insulator was 25 degree. Then, the substrate was dipped for 30 min in a solution of a fluoroalkyl silane coupling agent typically represented by $CF_3(CF_2)_7(CH)_2SiCl_3$ dispersed in an fluoro solvent to form an SAM film 16 on the alumina film 15 (upper plan view: FIG. 21A, cross sectional view: FIG. 21B). At this instance, the contact angle of the surface of the SAM film 16 with water was 1000. Successively, formation of source and drain electrodes 6 (upper plan view: FIG. 22A, cross sectional view: FIG. 22B), formation of a wiring 8 (upper plan view: FIG. 23A, cross sectional view: FIG. 23B), and formation of an organic semiconductor film (upper plan view: FIG. 24A, cross sectional view: FIG. 24B) were performed in the same procedures as those in Example 3 except for using a water soluble metal-nano-particles (surface protected with citric acid). The positional displacement between the gate electrode and the source and drain electrodes of the transistor was 0.2 µm.

When the mobility of the transistor was measured, it was 0.09 cm$^2$/Vs. For the performance of the thin organic film transistor manufactured only by the printing step, an identical effect was obtained in comparison with a thin organic film transistor manufactured with no positional displacement for each portion.

EXAMPLE 5

This example shows a step of preparing an organic TFT of conducting the surface treatment to the substrate in the case where the difference of the contact angle with water between the surface of the substrate and the surface of the gate insulator is 30° or less.

Figure 25A:
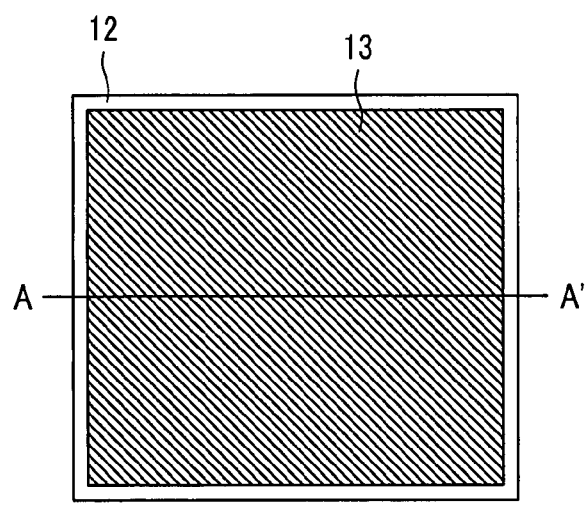
FIGS. 25A and 25B are a plan view and a cross sectional view, respectively, showing in the order of manufacturing steps of a transistor in Example 5 according to the invention.
Figure 25B:
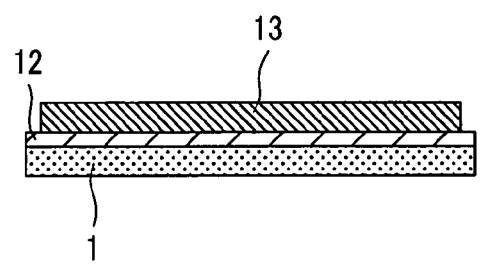
Figure 26A:
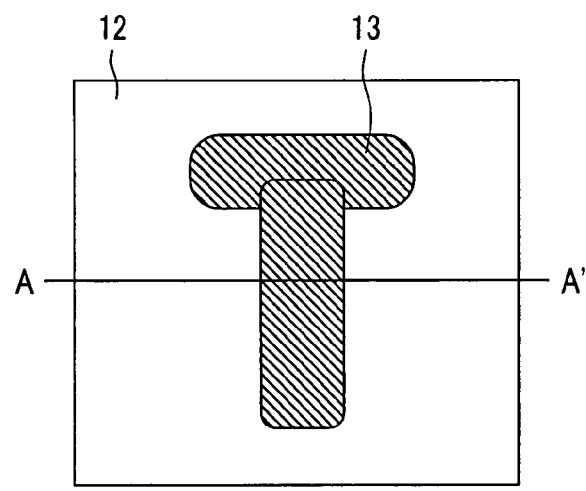
FIGS. 26A and 26B are a plan view and a cross sectional view, respectively, showing in the order of manufacturing steps of a transistor in Example 5 according to the invention.
Figure 26B:
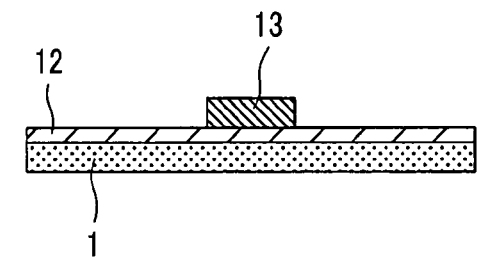
Figure 27A:
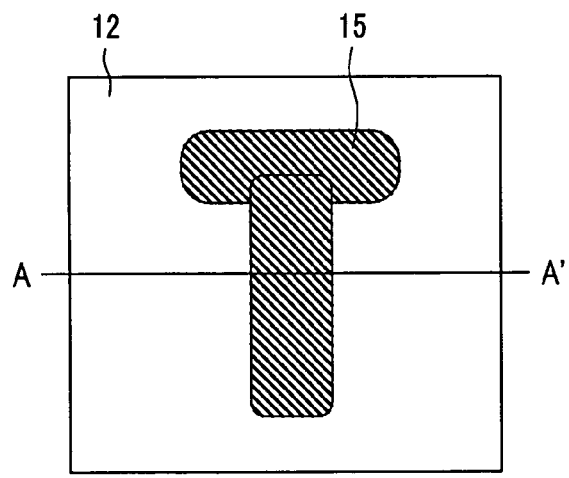
FIGS. 27A and 27B are a plan view and a cross sectional view, respectively, showing in the order of manufacturing steps of a transistor in Example 5 according to the invention.
Figure 27B:
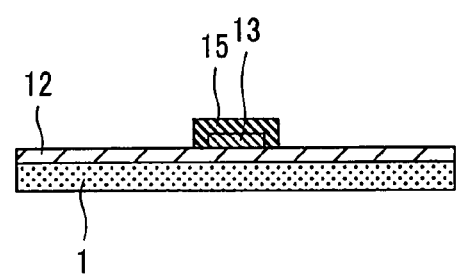
Figure 28A:
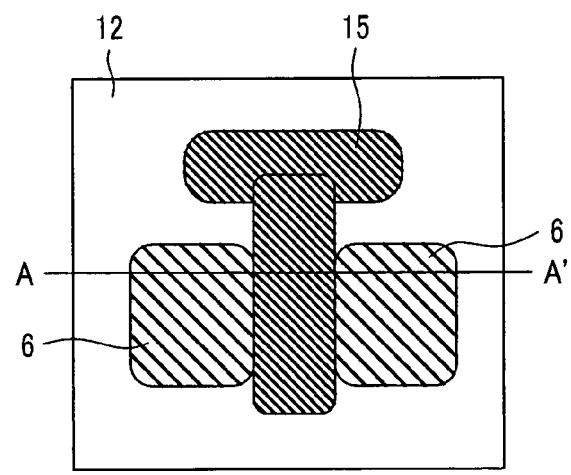
FIGS. 28A and 28B are a plan view and a cross sectional view, respectively, showing in the order of manufacturing steps of a transistor in Example 5 according to the invention.
Figure 28B:
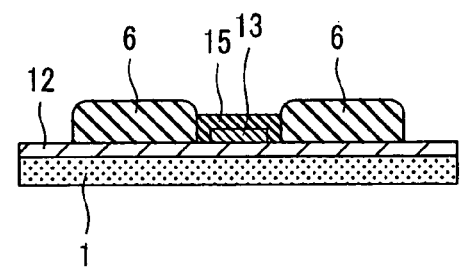
Figure 29A:
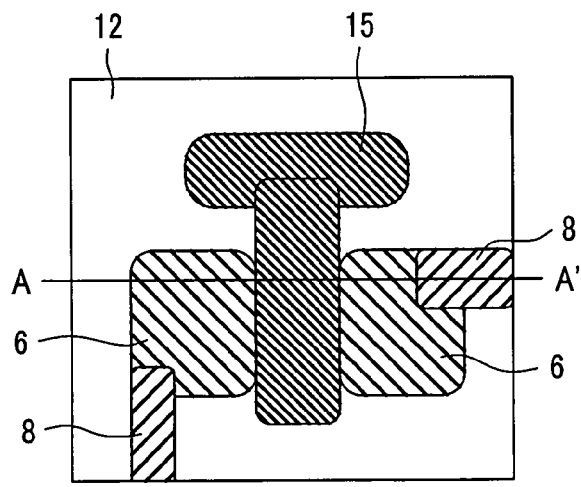
FIGS. 29A and 29B are a plan view and a cross sectional view, respectively, showing in the order of manufacturing steps of a transistor in Example 5 according to the invention.
Figure 29B:
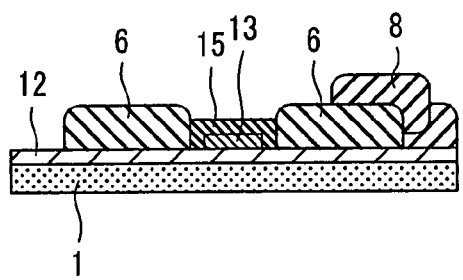
Figure 30A:
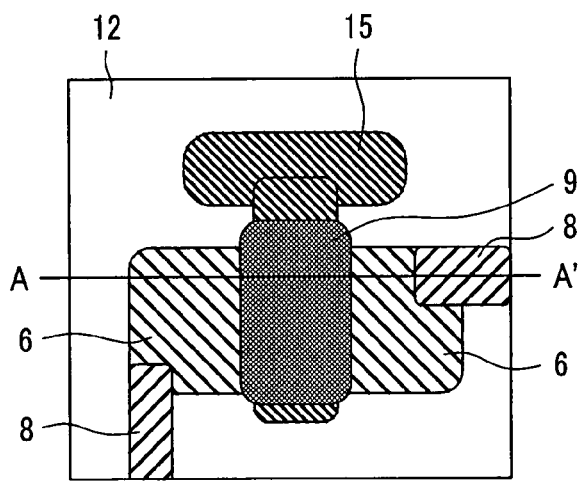
FIGS. 30A and 30B are a plan view and a cross sectional view, respectively, showing in the order of manufacturing steps of a transistor in Example 5 according to the invention.
Figure 30B:
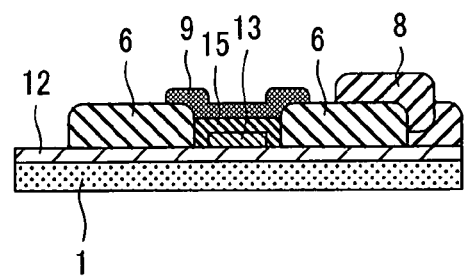

Basic manufacturing steps are identical with those in Example 3 except for using quartz for a substrate 1 and conducting a surface treatment to the substrate with a thin organic film. A 0.05 wt % xylene solution of epoxide polybutadiene was coated on a quartz substrate 1 by rotary coating and subjected to annealing at 200° C. for 10 min. A thin organic film 12 of about 0.5 nm thickness was obtained (upper plan view: FIG. 25A, cross sectional view: FIG. 25B). Succeeding steps were identical with those in Example 3. That is, a gate electrode 2 was formed (upper plan view: FIG. 26A, cross sectional view: FIG. 26B) and a gate insulator 15 was formed (upper plan view: FIG. 27A, cross sectional view: FIG. 27B). At this instance, the contact angle of the surface of the substrate 1 with water was 90 degree and the contact angle of the alumina film 15 as the gate insulator was 25 degree. Successively, formation of the source and drain electrodes 6 (upper plan view: FIG. 28A, cross sectional view: FIG. 28B), formation of the wiring 8 (upper plan view: FIG. 29A, cross sectional view: FIG. 29B), and formation of the organic semiconductor film (upper plan view: FIG. 30A, cross sectional view: FIG. 30B) were performed in the same procedures as those in Example 3. The positional displacement between the gate electrode and the source and drain electrodes of the transistor was 0.3 µm.

When the mobility of the transistor was measured, it was 0.09 cm$^2$/Vs. For the performance of the thin organic film transistor manufactured only by the printing step, an identical effect was obtained in comparison with a thin organic film transistor manufactured with no positional displacement for each portion.

Examples 1 to 5 described above show typical examples which had particularly high performance both in view of the cost and the performance. Various examples with change of the material, etc. in the examples described above will be described.

<For Substrate>

A thin organic film transistor was formed in the same manner as in Example 1 except for replacing a transparent substrate in Example 1 with a glass substrate. The mobility of the transistor was 0.11 cm$^2$/Vs which was equivalent with that of the plastic substrate.

Same effects can be obtained also by using, as the materials for the transparent film, polyimide derivatives, benzocyclobutene derivatives, photoacrylic derivatives, polystyrene derivatives, polyvinyl phenol derivatives, polycarbonate derivatives, polyester derivatives, polyvinyl acetate derivatives, polyurethane derivatives, polysulfone derivatives, acrylate resin, acrylic resins, and epoxy resins.

<For Conductive Material>

A transistor was formed quite in the same manner as in Example 1 except for replacing gold-nano-particles in Example 1 with silver-nano-particles. The mobility of the transistor was 0.08 cm$^2$/Vs. The mobility was 0.1 cm$^2$/Vs in the case of using the platinum-nano-particles, and the mobility was 0.08 cm$^2$/Vs in the case of using copper-nano-particles which provide identical performance as that in the use of gold-nano-particles. In each of the materials described above, while there is a difference in view of the characteristic due to the difference of the work function, for example, between gold and silver, the purpose of the invention can be attained sufficiently. Among them, the materials gold-nano-particles are most advantageous material with a view point of various aspects such as the performance, easiness of synthesis, cost and, further, store stability.

As the solvent for the conductive material, photosensitive composition solvents such as methyl amyl ketone, ethyl lactate, cyclohexanone, propylene glycol monomethyl ether, propylene glycol-1-monomethyl ether-2-acetate, etc. ethers such as diethyl ether, acetone, and tetrahydrofuran, toluene, chloroform, etc. can be used as the organic solvent.

<For Organic Semiconductor Material>

A transistor was formed quite in the same manner as in Example 1 except for replacing the solution of gold-nano-particles in Example 1 with a polyaniline solution doped with emeraldine salt. The mobility of the transistor was 0.10 cm$^2$/Vs. The purpose of the invention could also be attained efficiently also by such example.

Further, a transistor was formed by using a 1.3 wt % aqueous solution of an organic semiconductor, poly(styrene sulfonate)/poly(s,3-dihydrothieno-[3,4-b]-1,4-dioxin) in Example 1. The mobility of the transistor was 0.088 cm$^2$/Vs. This example is somewhat advantageous in view of the cost.

gate insulator, the mobility of the transistor was 0.11 cm$^2$/Vs. Such an example could also attain the purpose of the invention sufficiently.

<Combination of Various Steps in the Second Embodiment>

As described above, the second embodiment of the invention can be practiced by using various combinations for the property of the gate insulator to the liquid, the property of the surface of the substrate to the liquid, and the property of the solution of the metal material for use in source/drain electrodes. Table 1 collectively shows the combination of them and the effect of the invention can be obtained sufficiently also with them.

TABLE 1

| Gate insulator | Metal oxide film (hydrophilic) | | | | | |
|---|---|---|---|---|---|---|
| Substance for the surface of the substrate | SiO$_2$ | | Hydrophilic organic compound | | Hydrophobic organic compound | |
| Treatment for surface of the substrate | Formation of hydrophobic organic film | Formation of hydrophobic SAM | Formation of hydrophobic organic film | Formation of hydrophobic SAM | — | — |
| Surface treatment for gate insulator | | — | | | Formation of hydrophobic SAM | — |
| Property of solution of metal-nano-particles | Water insoluble | | Water soluble | | Water insoluble | |

The same effect can be obtained also by using, as the organic semiconductor material, polyacene derivatives such as pentacene, polythiophene derivatives, polyethylene derivatives, polypyrrole derivatives, polyisothianaphthene derivatives, polyaniline derivatives, polyacetylene derivatives, polydiacetylene derivatives, polyazulene derivatives, polypylene derivatives, polycarabazole derivatives, polyselenophene derivatives, polybenzofuran derivatives, polyphenylene derivatives, polyindole derivatives, polypyridazine derivatives, metallophthalocyanine derivatives, fullerene derivatives, or polymers or oligomers comprising two or more of such repetitive units in admixture.

<For Insulator>

In the case of using a 0.5% xylene solution of epoxide polybutadiene for the insulator in Example 1, the mobility was 0.11 cm$^2$/Vs. The value substantially equal with the value in Example 1. This example is somewhat advantageous in view of the cost.

The mobility in the case of using a 2% methyl amyl ketone solution of polyhydroxystyrene was 0.11 cm$^2$/Vs, and the purpose of the invention can be attained. Polyhydroxystyrene in this example is inexpensive and has an advantage capable of using methyl amyl ketone as a safe solvent.

<Gate and Gate Insulator>

While an example of aluminum was shown for the gate material, in a case of using a noble metal material such as gold, platinum, and copper for the gate material, a thiol compound, amino compound, or carboxylic acid compound can be used as the SAM material for the gate insulator. In the case of using gold for the gate electrode and dodecane thiol for the Among the various steps described above, principal steps are set forth as below.

(1) The second embodiment is basically as described below. Description is to be made based on the step.

A method of manufacturing a semiconductor device having an organic semiconductor film including:

(a) a step of forming a gate electrode on a substrate, (b) a step of forming a gate insulator covering the gate electrode, (c) a step of forming a layer containing metal-nano-particles to a region of a source electrode and a drain electrode above the thus prepared substrate, (d) a step of solidifying the layer containing the metal-nano-particles, and (e) a step of forming an organic semiconductor layer covering at least the gate insulator, (f) conducting a step of forming the layer containing the metal-nano-particles after attaining the state where the property of the region for the source electrode, and the drain electrode, and the property of the region other than region for the source electrode and the drain electrode are contrary to each other with respect to the hydrophilic property and the hydrophobic property, and (g) using a water soluble solution of metal-nano-particles in the case where the surface of the substrate is hydrophilic and using a water insoluble solution of metal-nano-particles in the case where the surface of the substrate is hydrophobic upon forming the layer containing the metal-nano-particles.

(2) A method of manufacturing a semiconductor device having an organic semiconductor film according to (1) above wherein the difference for the property of the surface between each of the regions with respect to the hydrophobic property and the hydrophilic property is such that the difference of contact angle with water in each of the regions is 30° or more.

(3) A method of using a substrate having a surface comprising $SiO_2$ and rendering a portion other than the region covered with the gate insulator hydrophobic A method of manufacturing a semiconductor device having an organic semiconductor film according to (1) above wherein the method includes (a) a step of forming a gate electrode on a substrate having a surface comprising $SiO_2$, (b) a step of forming a gate insulator covering the gate electrode, (c) a step of rendering the $SiO_2$ film hydrophobic in a region other than the region covered with the gate insulator, (d) a step forming a water insoluble layer containing a metal-nano-particles in a region of a source electrode and a drain electrode above the thus prepared substrate, and (f) a step of forming an organic semiconductor layer covering at least the gate insulator.

(4) A method of manufacturing a semiconductor device having an organic semiconductor film according to (2) above wherein the property of the $SiO_2$ film after the hydrophobic treatment is such that the difference between a contact angle with water of the region covered with the gate insulator and a contact angle with water in the $SiO_2$ film other than the region covered with the gate insulator is 30° or more.

(5) A method of using a substrate having a surface comprises $SiO_2$ and forming a portion other than the region covered with the gate insulator to a hydrophobic thin organic film A method of manufacturing a semiconductor device having an organic semiconductor film according to (2) above wherein the step (a) for rendering the $SiO_2$ film hydrophobic in the region other than the region covered with the gate insulator is a step of forming a hydrophobic thin organic film in the region of the $SiO_2$ film.

(6) A method of manufacturing a semiconductor device having an organic semiconductor film according to (2) above wherein the step of rendering the $SiO_2$ film hydrophobic in the region other than the region covered with the gate insulator is a step of forming a self-assembled monolayer in the region of the $SiO_2$ film.

(7) A method of manufacturing a semiconductor device having an organic semiconductor film according to (2) above wherein the step of rendering the $SiO_2$ film hydrophobic in the region other than the region covered with the gate insulator has a step of forming an SAM film above the substrate before the step of forming the gate electrode on the substrate, and the step of forming the layer containing metal-nano-particles to the region of the source electrode and the drain electrode is performed by a printing method.

(8) A method of manufacturing a semiconductor device having an organic semiconductor film according to (2) above wherein the step of forming the self-assembled monolayer in the region of the $SiO_2$ film is performed by a printing method.

(9) A method of using the substrate having a surface of a hydrophilic organic compound layer and rendering the region other than the region covered with the gate insulate film hydrophobic A method of manufacturing a semiconductor device having an organic semiconductor film according to (1) above wherein the method includes (a) a step of forming a gate electrode on a substrate having a surface of a hydrophilic thin organic film, (b) a step of forming a gate insulator covering the gate electrode, (c) a step of rendering a region other than the region covered with the gate insulator hydrophobic, (d) a step of forming a layer containing water insoluble metal-nano-particles in a region of a source electrode and a drain electrode above thus prepared substrate, (e) a step of solidifying the layer containing the metal-nano-particles, and (f) a step of forming a semiconductor layer covering at least the gate insulator.

(10) A method of manufacturing a semiconductor device having an organic semiconductor film according to (9) above wherein the step of rendering the region other than the region covered with the gate insulator hydrophobic is to form a hydrophobic thin organic film in a region other than the region covered with the gate insulator.

(11) This example is a method of using a hydrophilic organic compound layer and a hydrophobic SAM film.

A method of manufacturing a semiconductor device having an organic semiconductor film according to (3) above wherein the step of rendering the region other than the region covered with the gate insulator hydrophobic is to form a self-assembled monolayer in the region other than the region covered with the gate insulator.

(12) This example is a method of using a substrate having a surface of a hydrophilic organic compound layer and a hydrophobic gate insulator.

A method of manufacturing a semiconductor device having an organic semiconductor film according to (1) above including;

(a) a step of forming a gate electrode on a substrate having a surface of a hydrophilic thin organic film, (b) a step of forming a gate insulator covering the gate electrode, (c) a step of rendering the region covered with the gate insulator hydrophobic, (d) a step of forming a water soluble layer containing metal-nano-particles in a region of a source electrode and a drain electrode above the thus prepared substrate, (e) a step of solidifying the layer containing the metal-nano-particles, and (f) a step of forming an organic semiconductor layer covering at least the gate insulator.

(13) This example is a method of using a substrate having a surface of a hydrophobic organic compound layer and a hydrophilic gate insulator.

A method of manufacturing a semiconductor device having an organic semiconductor film according to (7) above including;

(a) a step of forming a gate electrode on a substrate having a surface of a hydrophobic organic compound, (b) a step of forming a hydrophilic gate insulator covering the gate electrode, (c) a step of forming a water insoluble layer containing metal-nano-particles in a region of a source electrode and a drain electrode above the thus prepared substrate, (d) a step of solidifying the layer containing the metal-nano-particles, and (e) a step of forming an organic semiconductor layer covering at least the gate insulator.

(14) This example is a method of manufacturing a semiconductor device having an organic semiconductor film according to (1) above wherein the step of solidifying the layer containing metal-nano-particles is performed by exposure from above the surface of the substrate on which the gate electrode is mounted.

Basic embodiments of the invention are as has been described above. The invention provides the following advantage in the step of manufacturing the organic semiconductor. (1) Necessary material is drawn for a necessary area by a printing method, and (2) a portion requiring positioning for a lower electrode and the upper electrode is prepared by positioning the lower electrode and an upper electrode in self-alignment. Accordingly, an electrode substrate with the lower electrode and the upper electrode accurately positioned by way of the insulator can be formed by using the printing method. By using the printing method of the invention, a necessary material needs only to be used for the required minimum area and, in addition, a photomask or a resist-lithographic step is not necessary and an etching step, for example, of preparing through holes is not necessary. Accordingly, manufacturing cost can be saved greatly.

In the invention, since all the steps can be performed at a low temperature, the upper wiring/electrode can be formed in self-alignment with respect to the lower electrode even in the case where the substrate is formed of a material such as a plastic which is flexible and has a thermoplasticity capable of being thermally deformed. This is suitable to a substrate for preparing a display such as a flexible electronic paper using the substrate.

EXAMPLE 6

In this example, the invention is described for a specific m×n active matrix type thin film transistor substrate and a manufacturing method thereof. Each of the steps of this example will be described with reference to FIG. 31A to FIG. 34B. The m×n active matrix type thin film transistor substrate comprises thin film transistors by the number of m×n formed at intersections of gate electrode wirings by the number of m constituting at least a portion of a lower electrode and signal wirings by the number of n constituting at least a portion of an upper electrode. Basic preparation procedures are identical with those in Example 3.

Figure 31A:
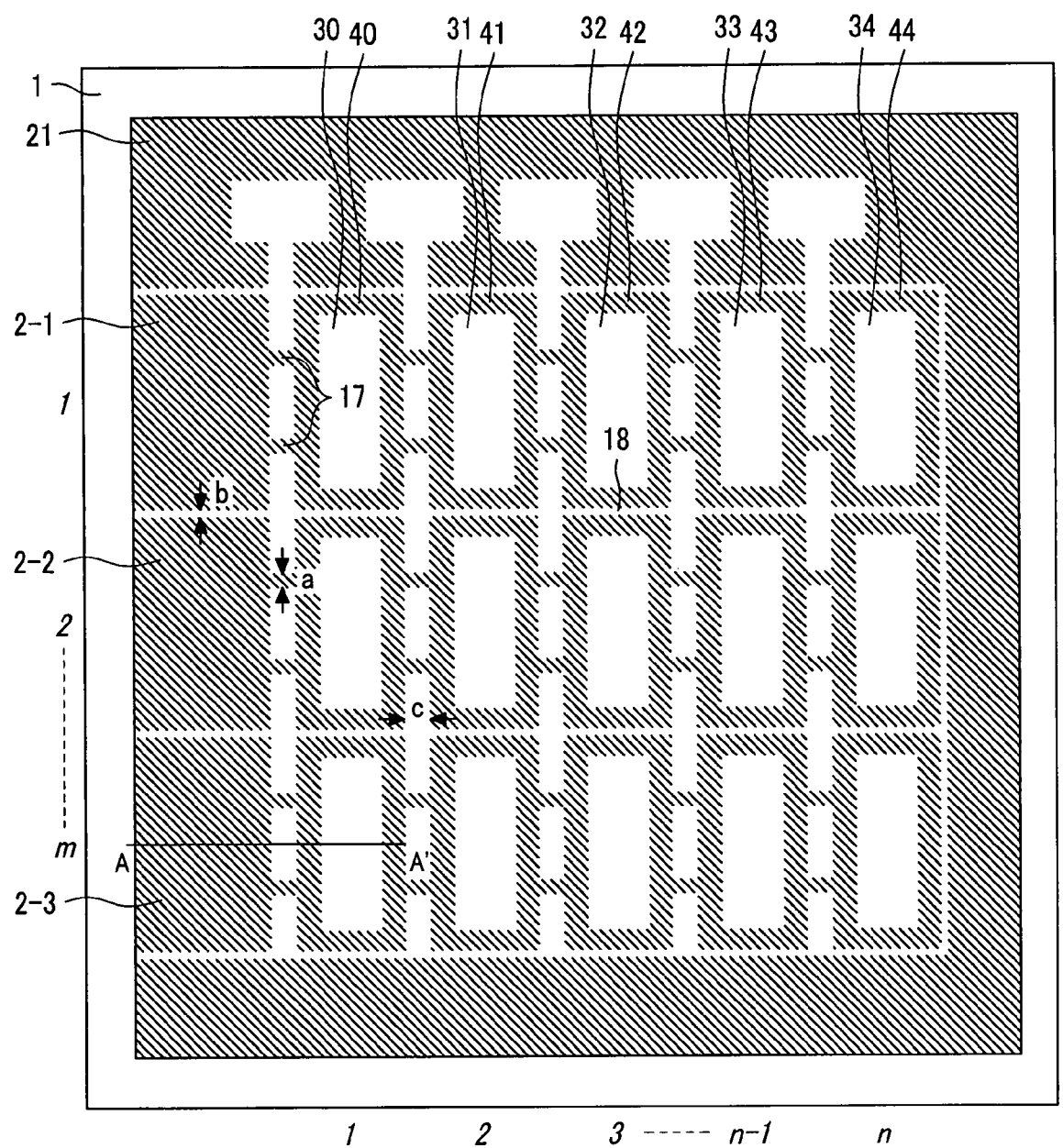
FIG. 31A is a plan view showing in the order of manufacturing steps of a transistor in Example 6 according to the invention.
Figure 31B:
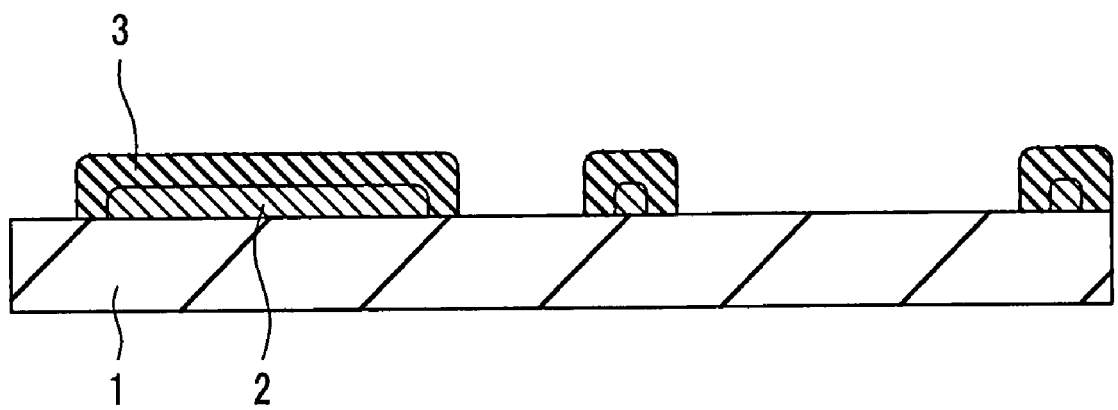
FIG. 31B is a plan view and a fragmentary cross sectional view showing in the order of manufacturing steps of a transistor in Example 6 according to the invention.

FIG. 31A is a plan view showing a state in which lower electrodes 2-1, 2-2, and 2-3 are formed to a substrate 1. Gate wirings/electrodes 2 by the number of m are arranged in close relation to each other each by way of a spacing 18, in which ring-like rectangles by the number of n each having an opening are arranged adjacent with each other and connected to each other by at least one or more of connection portions 17 (two positions in this example) (upper plan view: FIG. 31A, cross sectional view: FIG. 31B). That is, references 2-1, 2-2, and 2-3 show the regions for the gate wiring/electrode 2. While the gate wiring/electrodes are specifically shown by the number of three in the drawing, they are prepared by the number of m as shown by the reference on the left periphery. Openings depicted by references 30 to 34 are disposed to the regions of the gate wirings/electrodes 2 respectively. While openings are shown specifically by the number of four in the drawing, they are actually provided by the number of n as shown by the reference on the right periphery. The gate wirings/electrodes constituting the openings 30 to 34 form ring-like rectangles 40, 41, 42, 43 and 44. The ring-like rectangles are connected at adjacent rectangles to each other by way of fine connection portions 17. In this example, the connection portion is shown for two positions. Further, more connection portions can be provided.

Further, the thus formed gate wirings/electrodes 2-1, 2-2, and 2-3 are arranged by way of spacings 18. While the gate wirings/electrodes are shown by the number of three in the drawing, they are provided by the number of m as described above. In particular, in the case where the width b for the spacing 18, and the width a for each of the connection portions 17 are smaller than the spacing c between each of the rectangles having the ring-shaped opening, when a solution of a conductive material is coated and baked in the spacing c, the upper electrodes 23 by the number of n that function as the signal wiring/drain electrodes can be formed in a linear shape while overriding the hydrophilic region on the connection portion 17 and self-aligned continuously with the lower electrode. There is no worry that the solution of the conductive material penetrates in the spacing 18 to short-circuit the upper electrodes 23 with each other.

FIG. 31B is a cross sectional view along line A-A' in FIG. 31A. A lower electrode 2, and a gate insulator 3 covering thereover are formed above the substrate 1.

Figure 32A:
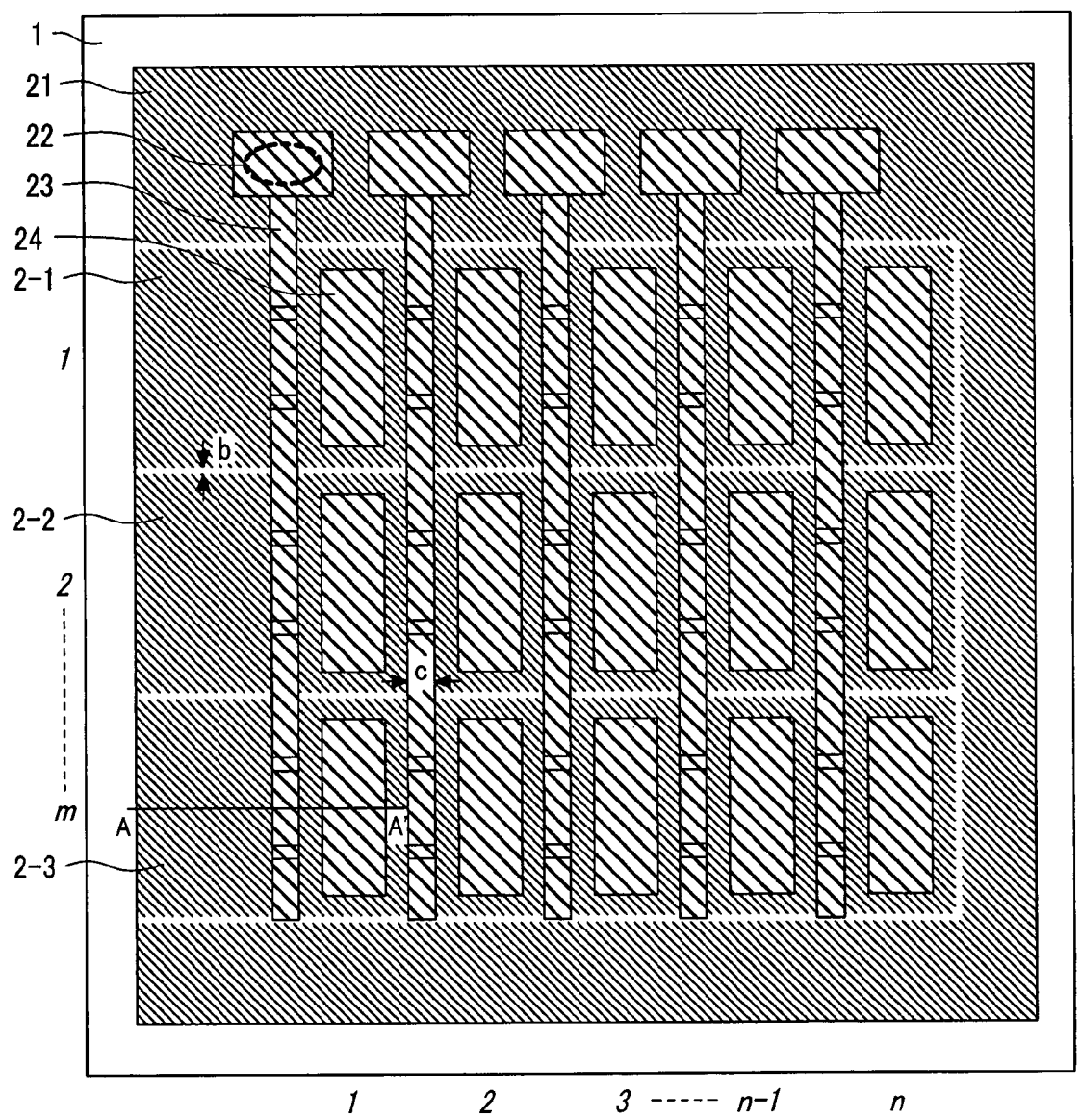
FIG. 32A is a plan view showing in the order of manufacturing steps of a transistor in Example 6 according to the invention.
Figure 32B:
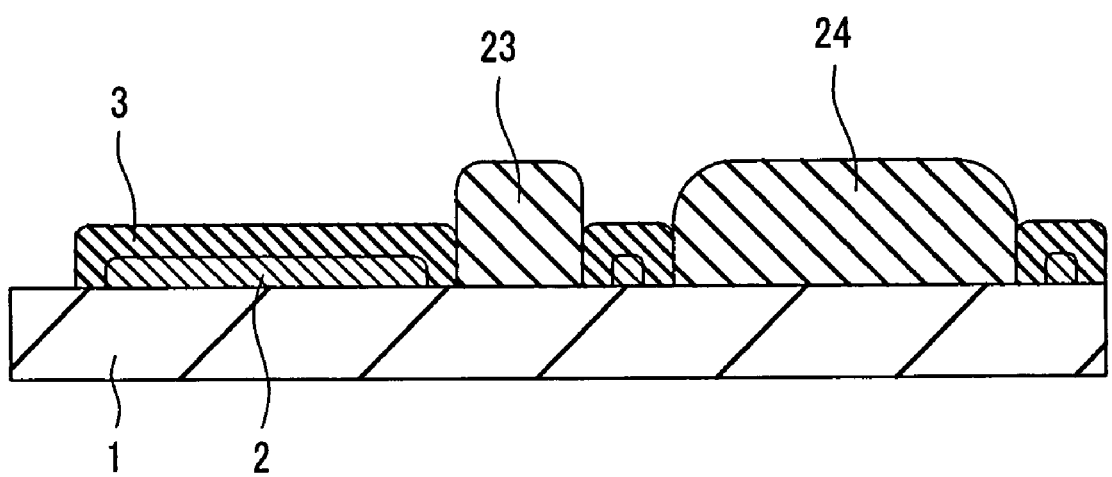
FIG. 32B is a cross sectional view showing in the order of manufacturing steps of a transistor in Example 6 according to the invention.
Figure 33A:
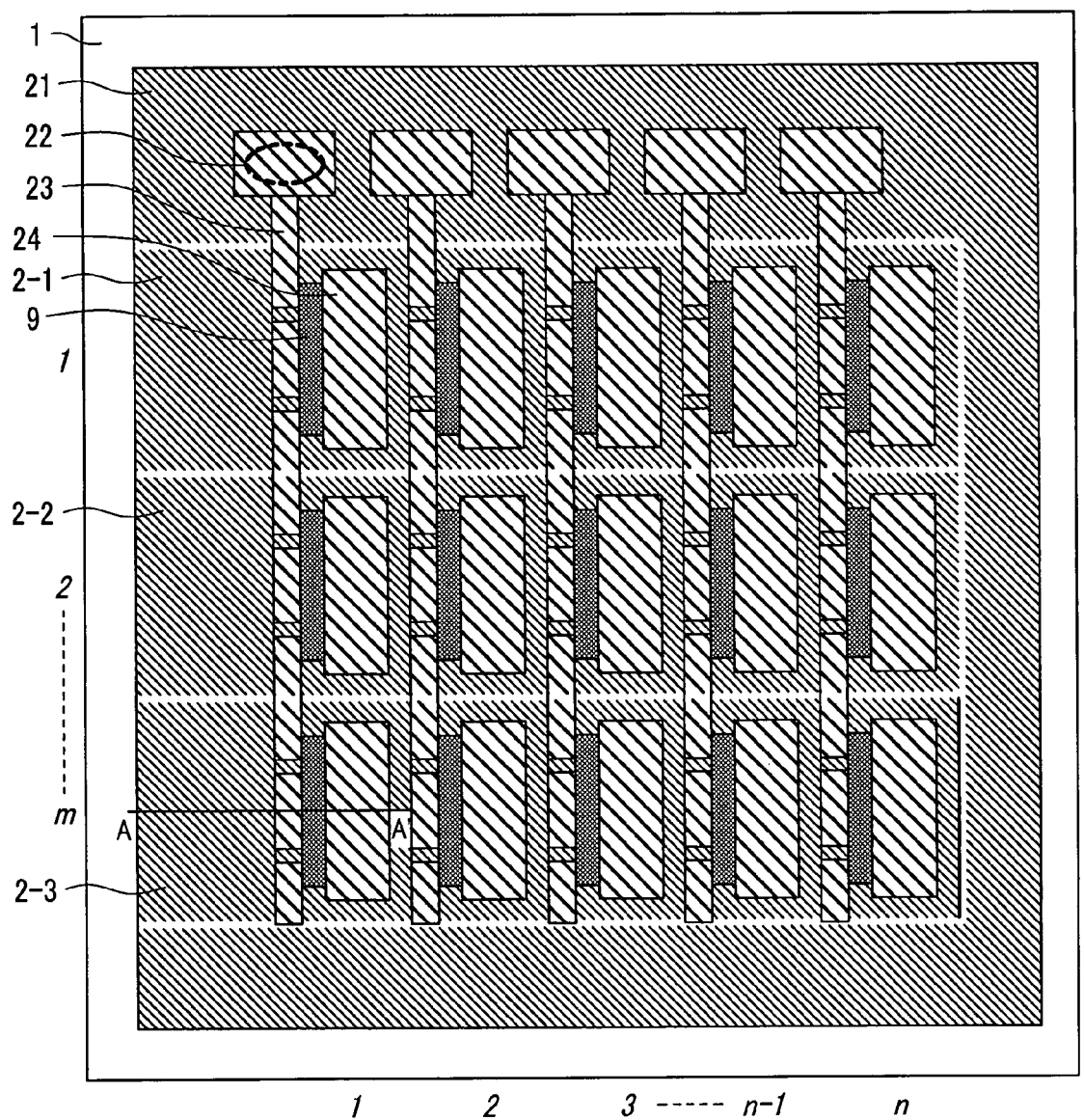
FIG. 33A is a plan view showing in the order of manufacturing steps of a transistor in Example 6 according to the invention.
Figure 33B:
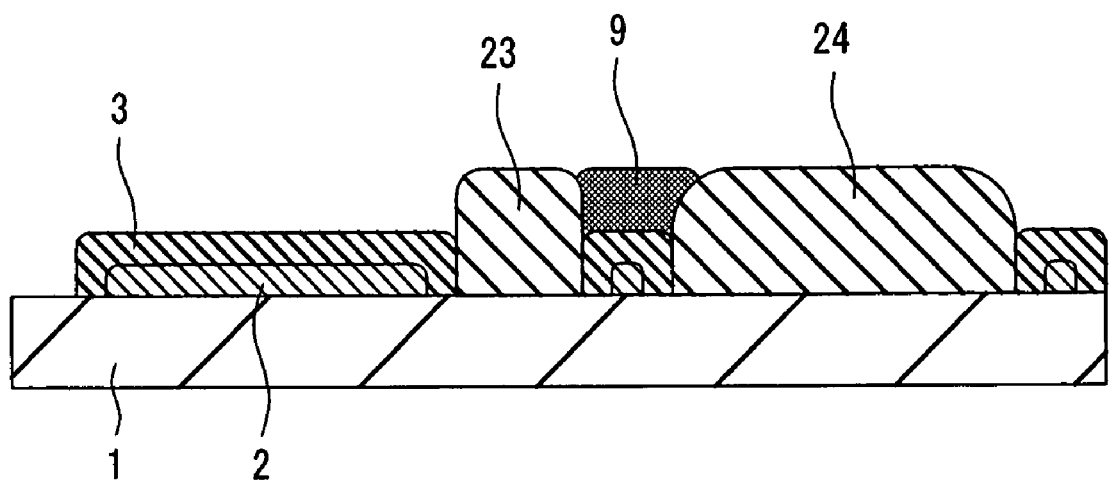
FIG. 33B is a fragmentary cross sectional view showing in the order of manufacturing steps of a transistor in Example 6 according to the invention.
Figure 34A:
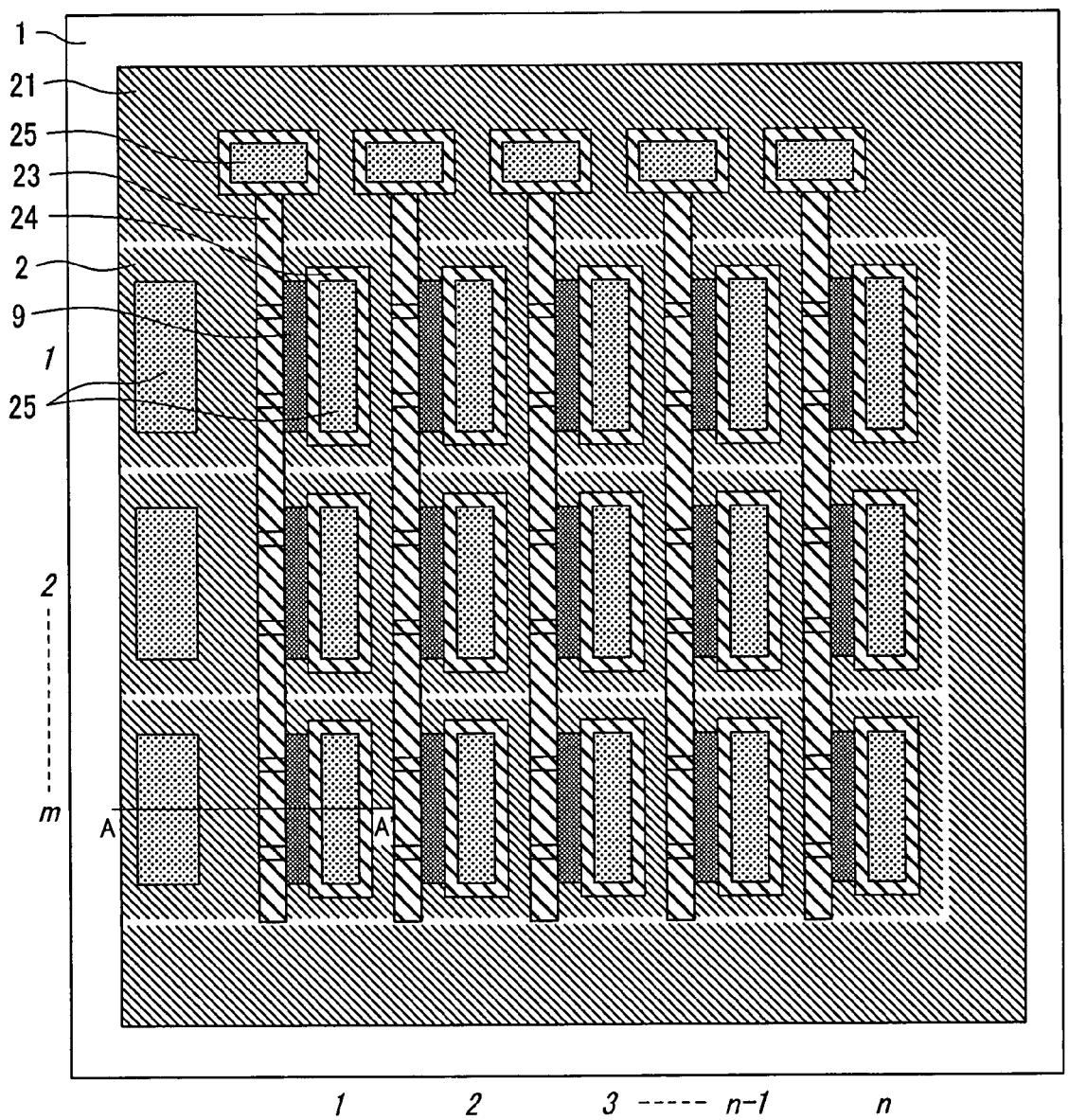
FIG. 34A is a plan view showing in the order of manufacturing steps of a transistor in Example 6 according to the invention.
Figure 34B:
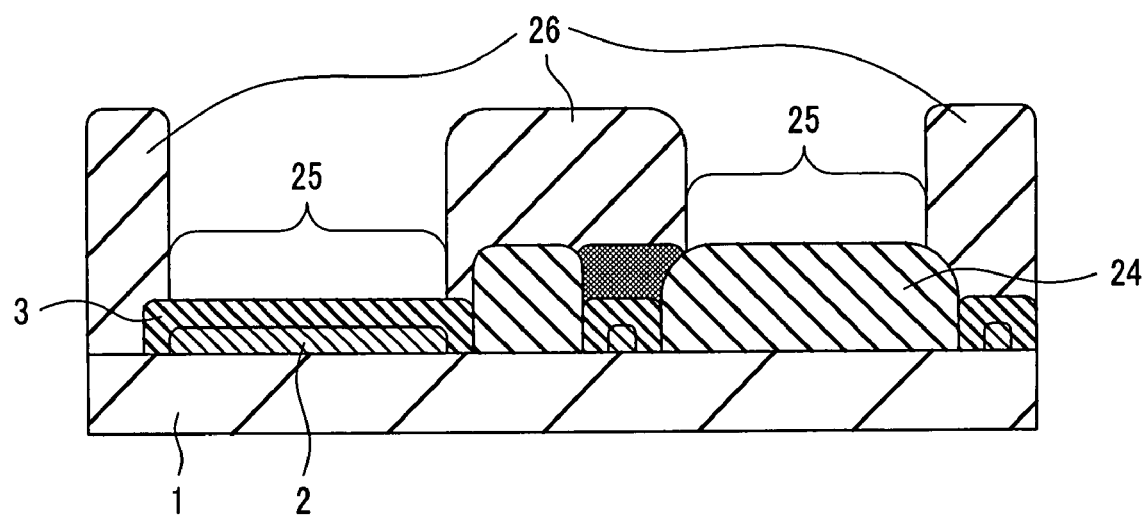
FIG. 34B is a fragmentary cross sectional view, showing in the order of manufacturing steps of a transistor of Example 6 according to the invention.

FIG. 33A is a plan view showing the state in which source and drain electrodes 23, 24 and an organic semiconductor layer 9 are disposed in the state of FIG. 31A. In the drawing, the drain electrode 23, 24 and the organic semiconductor layer 9 for each of the transistors disposed by the number of 3×5 are shown collectively each by one reference. FIG. 33B is a cross sectional view along line A-A' in FIG. 33A. In this example, a terminal-forming lower electrode 21 formed integrally as a portion of lower electrode 2-1, 2-2, or 2-3 is disposed so as to surround the outer periphery of the gate wirings/electrodes by the number of m. The upper electrode 23 can be prevented from being formed to the end of the substrate 1 at the outside to the terminal-forming lower electrode 21 by appending a seal mask to the portion and peeling the same after forming the upper electrode 23. Further, in this example, the width of the signal terminal portion 22 of the terminal-forming lower electrode 21 is made larger than the width c of the upper electrode. This is formed not only for enlarging the area of the upper electrode terminal thereby lowering the contact resistance with the signal circuit to be described later but also for utilizing the same as an ink reservoir for coating and forming a relatively long signal wiring 23 with a solution of a conductive material. That is, in the case where the solution of the conductive material dropped along the spacing of width c for forming the signal wiring 23 is excessive, the solution of the conductive material flows into the signal terminal portion 22 and, on the other hand, in the case where it is insufficient, the solution of the conductive material is supplied from the signal terminal 22 to form the upper electrode 23 with an appropriate amount of the solution of the conductive material (upper plan view: 32A, cross sectional view: FIG. 32B). A semiconductor film 9 is formed by the same method and with the same material as those in Example 3, thereby forming thin film transistors by the number of m×n at the intersections of the gate wirings 2 by the number of m and the signal wirings 23 by the number of n (upper plan view: FIG. 33A, cross sectional view: FIG. 33B). Further, a protective film 26 is formed over them. In this case, through holes 25 are formed to establish wiring. As described above, an active matrix type thin film transistor substrate arranged in self-alignment can be formed (upper plan view: FIG. 34A, cross sectional view: FIG. 34B). When the matrix of the transistors are thus prepared and the performances of the respective transistors were compared, it has been found that those having quite identical performance can be prepared without any variations.

Description of reference numerals used in the drawings the specification is as follows:

1 substrate
2 lower electrode, gate wiring/electrode
3 gate insulator
4 solution of conductive material -continued 5 exposure light
6 upper electrode, source and drain electrodes
7 wiring
8 wiring
9 organic semiconductor
10 wiring
11 protective film, passivation film
12 thin organic polymer film
13 aluminum
14 polymer material
15 aluminum oxide, aluminum
16 self-assembled monolayer (SAM film)
17 connection portion for gate wirings
18 spacing between adjacent gate wrings/electrodes
19 thin organic film transistor
20 thin organic film transistor
21 signal terminal-forming lower electrode
22 signal terminal
23 source electrode
24 drain electrode
25 through hole
26 protective film

What is claimed is:

1. A method of manufacturing a semiconductor device having an organic semiconductor film, comprising:
    forming a gate electrode on a substrate,
    forming a gate insulator, said gate insulator being more hydrophobic or more hydrophilic than a surface of said substrate, by anodizing said gate electrode,
    supplying a solution containing metal-nano-particles on the surface of the substrate and not on the gate insulator, due to the gate insulator being more hydrophobic or more hydrophilic than the surface of said substrate,
    baking said solution containing the metal-nano-particles, which is on the surface of the substrate and not on the gate insulator, so that the source and drain electrodes are formed separately from each other, and
    forming an organic semiconductor layer at least covering said gate insulator.

2. A method of manufacturing a semiconductor device having an organic semiconductor film according to claim 1, wherein said gate electrode contains aluminum.

3. A method of manufacturing a semiconductor device having an organic semiconductor film according to claim 2, wherein said gate insulator contains aluminum oxide, formed by anodizing aluminum contained in the gate electrode.

4. A method of manufacturing a semiconductor device having an organic semiconductor film according to claim 1, wherein said gate insulator is more hydrophilic than a surface of the substrate, and said solution containing metal-nano-particles is a water-insoluble solution containing the metal-nano-particles.

5. A method of manufacturing a semiconductor device having an organic semiconductor film according to claim 1, wherein said gate insulator is more hydrophobic than a surface of the substrate, and said solution containing metal-nano-particles is a water-soluble solution containing the metal-nano-particles.

* * * * *